(12) United States Patent
Khozikov et al.

(10) Patent No.: US 10,386,393 B2
(45) Date of Patent: Aug. 20, 2019

(54) ARC FLASH HAZARD ASSESSMENT FOR A 400-HZ SYSTEM

(71) Applicant: The Boeing Company, Chicago, IL (US)

(72) Inventors: Vyacheslav Khozikov, Bellevue, WA (US); Shengyi Liu, Sammamish, WA (US); Shawna Murray, Redmond, WA (US)

(73) Assignee: The Boeing Company, Chicago, IL (US)

( * ) Notice: Subject to any disclaimer, the term of this patent is extended or adjusted under 35 U.S.C. 154(b) by 281 days.

(21) Appl. No.: 15/582,481

(22) Filed: Apr. 28, 2017

(65) Prior Publication Data

US 2018/0313875 A1    Nov. 1, 2018

(51) Int. Cl.
*G01R 19/25* (2006.01)
*G01R 31/02* (2006.01)
*G01R 31/12* (2006.01)

(52) U.S. Cl.
CPC ....... *G01R 19/2513* (2013.01); *G01R 31/025* (2013.01); *G01R 31/12* (2013.01)

(58) Field of Classification Search
CPC ... G01R 19/2513; G01R 31/025; G01R 31/12
See application file for complete search history.

(56) References Cited

U.S. PATENT DOCUMENTS

| | | | |
|---|---|---|---|
| 6,522,509 B1 * | 2/2003 | Engel | H02H 1/0015 361/42 |
| 2005/0017731 A1 * | 1/2005 | Zuercher | H02H 1/0015 324/536 |

OTHER PUBLICATIONS

"IEEE Guide for Performing Arc-Flash Hazard Calculations", IEEE, 1584, 2002, 122 pgs.
"Selectivity, Back Up Protection and Coordination Guide", Eaton Industries, Australia, Oct. 2015, 342 pgs.
Czucha, J et al., "Hybrid Current Limiting Interrupting Device for 3-Phase 400 V AC Applications", 1998 Fifth International Conference on Trends in Distribution Switchgear: 400V-145kV for Utilities and Private Networks (Conf. Publ. No. 459), 1998, pp. 161-166.
Terzija, Vladimir V. , "On the Modeling of Long Arc in Still Air and Arc Resistance Calculation", IEEE Transactions on Power Delivery, vol. 19 No. 3, Jul. 2004, pp. 1012-1017.
Zalucki, Zdzislaw , "Influence of Current Frequency on the Dynamic Voltage/Current Characteristics of Vacuum Arcs", Proceed. of 17th International Symposium on Discharges and Electrical Insulation in Vacuum, 1996, pp. 204-209.

* cited by examiner

*Primary Examiner* — Manuel L Barbee
(74) *Attorney, Agent, or Firm* — Kwan & Olynick LLP

(57) ABSTRACT

In general, certain embodiments of the present disclosure provide methods and systems for determination and assessment of arc flash hazards at an equipment in an electrical power system operative at 400-Hz. According to various embodiments, a method is provided comprising determining an arc current at the equipment and generating an arc flash model based on the determined arc current. The method further comprises determining a value of arc flash incident energy by use of the arc flash model. In some embodiments, an arc flash protection boundary distance and/or a level of Prosomal Protection Equipment (PPE) are further determined by use of the value of arc flash incident energy for the equipment in the 400-Hz electrical power system.

33 Claims, 10 Drawing Sheets

ARC FLASH HAZARD ASSESSMENT FOR A 400-HZ SYSTEM

TECHNICAL FIELD

The present disclosure relates generally to arc flash analysis, and, more specifically, to methods and systems for arc flash hazard assessment and determination in a 400-Hz electrical power system.

BACKGROUND

Given the complexity of electrical power systems, it is only natural that electrical faults would occur therewithin. For instance, incidents of short circuit at contactors or transmission lines may generate a fault as an abnormal amount of electric current is experienced in the system. Arc flashes or arc faults occur when an electric current travels through an air gap between energized conductors, or from conductors to ground, absent sufficient insulation or isolation to withstand the applied voltage in the electrical system. In an electrical power system providing different phase of voltage, arc fault incidents occur, for example, phase to phase, phase to ground, or phase to phase to ground.

Arc flash hazards result from a rapid energy release from an arc fault. Even though the duration time of an arc event may last only in measurement of milliseconds, an extraordinary amount of incident energy can nevertheless be generated as electrical arcs usually have a high temperature and thus radiate a heat or heated gas or intense light or pressure of waves within a certain distance from the arc. The amount of heat or energy exposed to a worker is a function of the temperature of the heat source of an arc and the distance therefrom. When incident energy is calculated in the unit of calories per $cm^2$, an energy density of 1.2 Cal/$cm^2$ is sufficient to cause second degree burns on exposed human skin.

Given the seriousness and frequency of injuries from exposure to arc flash incidents, the United States the Occupational Safety and Health Administration (OSHA) is enforcing recommendations by the National Electric Code (NEC) and National Fire Protection Association (NFPA) regarding employee safety procedures when work on energized systems is necessary. For example, one of the requirements under the regulations of the OSHA is the designation of a distance of protection boundary that marks where personnel could not enter without wearing appropriate protective gear and clothing such as fire-retardant suit.

The NFPA-70E guidelines promulgate requirements for safe work practices to protect personnel by reducing exposure to major types of electrical hazards such as arc flashes in compliance with OSHA regulations at workplace. Calculation of incident energy of arc flashes are also suggested by the guidelines. For instance, the Institute of Electrical and Electronic Engineers (IEEE) Standard 1584-2002, hereinafter IEEE Standard 1584, utilizes empirical testing data derived formula for calculating the value of arc incident energy and the distance of the protection boundary.

The IEEE Standard 1584, incorporated herein by reference, provides for methods to determine an arc flash hazard boundary distance and an amount of incident energy that is radiated by the arc that a worker is likely to be exposed to upon working or servicing an electrical equipment or upon being present in the vicinity of the arcing incident. The IEEE calculations uses variables with regard to information of enclosure geometry, wire spacing, and fault duty, etc. The Standard sets forth nine procedure steps in determining arc fault incident energy.

Although the IEEE Standard 1584 has been widely used in the industry to addressing arc flash hazards within electrical systems, it is only applicable to ranges of voltages of 208 to 15,000 volts, operating at 50-60-Hz. However, like electrical systems operative at 60-Hz, systems of 400-Hz similarly require electrical equipment to be installed, tested, maintenance serviced or repaired. Likewise, workers and personnel are similarly subject to burns and other personal injuries caused by exposure to arc flashes as they do in 60-Hz electrical systems.

Thus, there is a need for arc flash analysis for electrical systems operating at frequencies other than the 50 to 60-Hz, for example, in the range of 400-Hz, so as to better quantify and determine arc flash hazards in order to protect workers and to promote safer as well as effective workplaces.

SUMMARY

The following presents a simplified summary of the disclosure in order to provide a basic understanding of certain embodiments of the present disclosure. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

In general, certain embodiments of the present disclosure provide techniques or mechanisms for analyzing arc flash to determine a current and hazards associated therewith. According to various embodiments, a power safety determination system is provided comprising a processor and a test unit interface (TUI) operatively coupled to the processor, the test unit interface for connecting to an equipment under test (EUT), the processor being programmed to execute instructions for controlling the TUI and perform operations. The instructions comprise the steps of determining an arc current at the equipment and generating an arc flash model based on the arc current. The instructions further comprise the step of determining a value of 400-Hz arc flash incident energy by use of the arc flash model, where a risk category is determined by use of the value of arc flash incident energy based on National Fire Protection Association (NFPA)-70E guidelines. In some embodiments, the value of 400-Hz arc flash incident energy is normalized for an arc having an arc duration of 0.2 seconds and a distance of 610 mm from the arc.

In some embodiments, the instructions further comprise the step of determining an arc flash protection boundary by use of the determined 400-Hz arc flash incident energy. In some other embodiments, the instructions further comprise the step of determining a level of Personal Protection Equipment (PPE) based on the value of the 400-Hz arc flash incident energy and National Fire Protection Association (NFPA)-70E guidelines. In still some other embodiments, the instructions further comprise the step of reporting the level of PPE to a user.

In some embodiments, the arc current is determined by a method comprising performing a short-circuit analysis of the equipment to determine a pair of bolted fault currents and a pair of equivalent impedances at a short circuit point at a first frequency of 60-Hz and a second frequency of 400-Hz, respectively. The method also comprises obtaining a pair of trip currents and a pair of corresponding trip times for a protection equipment at the first frequency of 60-Hz and the second frequency of 400-Hz, respectively. The method further comprises determining, by use of the trip currents and trip times, a pair of Joule Integral (JI) or $I^2t$ values of SA60 and SA400 for the equipment, with SA60 corresponding to a JI or $I^2t$ value for the first frequency of 60-Hz and SA400 corresponding to a JI or $I^2t$ value for the second frequency of 400-Hz. The method still further comprises determining a 400-Hz arcing current based on a 60-Hz arcing current and the pair of SA60 and SA400.

In some embodiments, the 60-Hz arc current is determined by use of the bolted fault current at the first frequency of 60-Hz. In some other embodiments, the 60-Hz arc current is determined by calculations specified in the IEEE Standard 1584.

In some embodiments, the arc flash model comprises a function based on a ratio of a first power input at the first frequency 60-Hz and a second power input at the second frequency 400-Hz. In some embodiments, the arc flash model further comprises a value of electric field intensity of a 400-Hz arc relative to a 60-Hz arc.

In some embodiments, the arc flash model comprises a function based on a difference of first value of arc flash incident energy at the frequency of 60-Hz and a second value of arc flash incident energy at the frequency of 400-Hz. The first value of arc flash incident energy is determined by calculations specified in the IEEE Standard 1584.

In another embodiment, a method for determining an arc current at an equipment of an electrical power system is provided. The method comprises performing a short-circuit analysis of the equipment to determine a pair of bolted fault currents and a pair of equivalent impedances at a short circuit point at a first frequency of 60-Hz and a second frequency of 400-Hz, respectively. The method also comprises obtaining a pair of trip currents and a pair of corresponding trip times for a protection equipment at the first frequency of 60-Hz and the second frequency of 400-Hz, respectively. The method further comprises determining, by use of the trip currents and trip times, a pair of Joule Integral (JI) or $I^2t$ values of SA60 and SA400 for the equipment, with SA60 corresponding to a JI or $I^2t$ value for the first frequency of 60-Hz and SA400 corresponding to a JI or $I^2t$ value for the second frequency of 400-Hz. The method still further comprises determining a 400-Hz arcing current based on a 60-Hz arcing current and the pair of SA60 and SA400.

In some embodiments, the 60-Hz arc current is determined by use of the bolted fault current at the first frequency of 60-Hz. In some other embodiments, the 60-Hz arc current is determined by calculations specified in the IEEE Standard 1584.

In yet another embodiment, a method for analyzing arc flash hazard at an equipment of an electrical power system is provided. The method comprises determining an arc current at the equipment and generating an arc flash model based on the arc current. The method further comprises determining a value of 400-Hz arc flash incident energy by use of the arc flash model, where a risk category is determined by use of the value of arc flash incident energy based on HAFT-70E. In some embodiments, the value of 400-Hz arc flash incident energy is normalized for an arc having an arc duration of 0.2 seconds and a distance of 610 mm from the arc. In some embodiments, the electrical power system comprises a multi-phase power system.

In some embodiments, the instructions further comprise the step of determining an arc flash protection boundary by use of the determined 400-Hz arc flash incident energy. In some other embodiments, the instructions further comprise the step of determining a level of Personal Protection Equipment (PPE) based on the value of the 400-Hz arc flash incident energy and National Fire Protection Association (NFPA)-70E guidelines. In still some other embodiments, the instructions further comprise the step of reporting the level of PPE to a user.

In some embodiments, the arc current is determined by a method comprising performing a short-circuit analysis of the equipment to determine a pair of bolted fault currents and a pair of equivalent impedances at a short circuit point at a first frequency of 60-Hz and a second frequency of 400-Hz, respectively. The method also comprises obtaining a pair of trip currents and a pair of corresponding trip times for a protection equipment at the first frequency of 60-Hz and the second frequency of 400-Hz, respectively. The method further comprises determining, by use of the trip currents and trip times, a pair of Joule Integral (JI) or $I^2t$ values of SA60 and SA400 for the equipment, with SA60 corresponding to a JI or $I^2t$ value for the first frequency of 60-Hz and SA400 corresponding to a JI or $I^2t$ value for the second frequency of 400-Hz. The method still further comprises determining a 400-Hz arcing current based on a 60-Hz arcing current and the pair of SA60 and SA400.

In some embodiments, the 60-Hz arc current is determined by use of the bolted fault current at the first frequency of 60-Hz. In some other embodiments, the 60-Hz arc current is determined by calculations specified in the institute of Electrical and Electronic Engineers (IEEE) Standard 1584.

In some embodiments, the arc flash model comprises a function based on a ratio of a first power input at the first frequency 60-Hz and a second power input at the second frequency 400-Hz. In some embodiments, the arc flash model further comprises a value of electric field intensity of a 400-Hz arc relative to a 60-Hz arc.

In some embodiments, the arc flash model comprises a function based on a difference of first value of arc flash incident energy at the frequency of 60-Hz and a second value of arc flash incident energy at the frequency of 400-Hz. The first value of arc flash incident energy is determined by calculations specified in the Institute of Electrical and Electronic. Engineers (IEEE) Standard 1584.

In still yet another embodiment, a non-transitory computer readable medium is provided comprising one or more programs configured for execution by a computer system to analyze arc flash hazard at an equipment of an electrical power system. In various embodiments, the one or more programs include instructions for performing a short-circuit analysis of the equipment to determine a pair of bolted fault currents and a pair of equivalent impedances at a short circuit point at a first frequency of 60-Hz and a second frequency of 400-Hz, respectively. The one or more programs also include instructions for obtaining a pair of trip currents and a pair of corresponding trip times for a protection equipment at the first frequency of 60-Hz and the second frequency of 400-Hz, respectively. The one or more programs further include instructions for determining, by use of the trip currents and trip times, a pair of Joule Integral (JI) or $I^2t$ values of SA60 and SA400 for the equipment, with SA60 corresponding to a JI or $I^2t$ value for the first frequency of 60-Hz and SA400 corresponding to a JI or $I^2t$ value for the second frequency of 400-Hz. The one or more programs further include instructions for determining a 400-Hz arcing current based on a 60-Hz arcing current and the pair of SA60 and SA400. In some embodiments, the one or more programs further include instructions for determining, by the processor, an arc flash protection boundary by use of the determined 400-Hz arc flash incident energy.

In some embodiments, the 60-Hz arc current is determined by use of the bolted fault current at the first frequency of 60-Hz. In some other embodiments, the 60-Hz arc current is determined by calculations specified in the Institute of Electrical and Electronic Engineers (IEEE) Standard 1584.

In some embodiments, the arc flash model comprises a function based on a ratio of a first power input at the first frequency 60-Hz and a second power input at the second frequency 400-Hz.

In some embodiments, the arc flash model comprises a function based on a difference of first value of arc flash incident energy at the frequency of 60-Hz and a second value of arc flash incident energy at the frequency of 400-Hz. The first value of arc flash incident energy is determined by calculations specified in the Institute of Electrical and Electronic. Engineers (IEEE) Standard 1584.

BRIEF DESCRIPTION OF THE DRAWINGS

The disclosure may best be understood by reference to the following description taken in conjunction with the accompanying drawings, which illustrate particular embodiments of the present disclosure.

DETAILED DESCRIPTION OF PARTICULAR EMBODIMENTS

Reference will now be made in detail to some specific examples of the present disclosure including the best modes for carrying out the systems and methods in the present disclosure. Examples of these specific embodiments are illustrated in the accompanying drawings. While the present disclosure is described in conjunction with these specific embodiments, it will be understood that it is not intended to limit the present disclosure to the described embodiments. On the contrary, it is intended to cover alternatives, modifications, and equivalents as may be included within the spirit and scope of the present disclosure as defined by the appended claims.

For example, the techniques of the present disclosure will be described in the context of particular functions, sub-functions, and data flows of certain network messages. However, it should be noted that the techniques of the present disclosure apply to other functional network flows and/or protocols with various functions, sub-functions, and data flows. In the following description, numerous specific details are set forth in order to provide a thorough understanding of the present disclosure. Particular example embodiments of the present disclosure may be implemented without some or all of these specific details. In other instances, well known process operations have not been described in detail in order not to unnecessarily obscure the present disclosure.

Various techniques and mechanisms of the present disclosure will sometimes be described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present disclosure unless otherwise noted. Furthermore, the techniques and mechanisms of the present disclosure will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Overview

The present disclosure provides systems and methods for determination and assessment of arc flash hazards in an electrical power system operative at 400-Hz. Arc current is calculated and arc flash models are generated in order to determine a value of arc flash incident energy at 400-Hz, which is utilized in turn to determine an arc flash protection boundary distance, as well as a level of Personal Protection Equipment (PPE).

Example Embodiments

Figure 1:
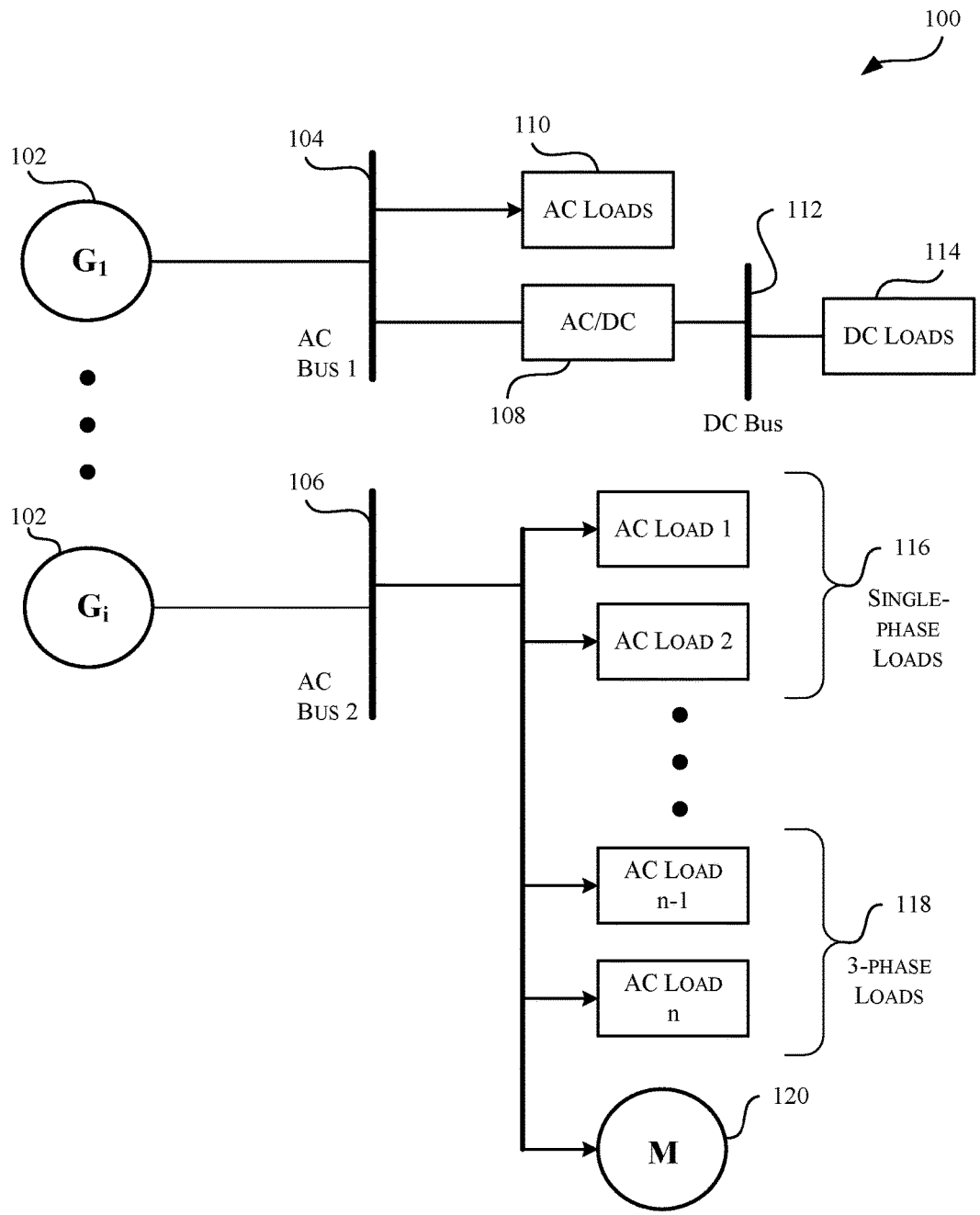
FIG. 1 illustrates a single line schematic diagram of a simplified example of an electrical power system operating at 400-Hz, with a plurality of sources of power generation and loads drawing currents at bus 1 and bus 2, in accordance with one or more embodiments of the present disclosure.

FIG. 1 illustrates a single line schematic view of a simplified example of an electrical power system operating at 400-Hz for implementing various methods and systems of the present disclosure, in accordance with one or more embodiments. In particular, electrical power system 100 comprises a plurality of generators 102 ($G_1, \ldots, G_i$) as power sources, with $G_1$ 102 and other generators (not shown) configured to feed to AC Bus 1 (104), and $G_i$ 102 and other generators (not shown) to AC Bus 2 (106). On the load side, a plurality of AC loads 110 draw AC currents directly from AC Bus 1 (104). In various embodiments, a conversion equipment such as a rectifier (AC/DC) 108 can be configured to convert AC power drawn from AC Bus 1 (104) into DC power, which is in turn supplied on DC Bus 112.

Similarly on the load side of DC Bus 112, not only a plurality of DC Loads 114 draw DC currents from DC Bus 112, but also a DC-to-DC converter (not shown) can be configured to further convert DC power from the voltage supplied at DC Bus 112 to a different voltage at an additional DC bus (not shown).

Like electrical power systems operating at the conventional 50 to 60-Hz, electrical power system 100 powers both single phase loads and three phase loads. As shown herein, single phase loads 116 (AC Load 1, AC Load 2 . . . ) connect to AC Bus 2 (106) while 3-phase loads 118 ( . . . AC Load n−1, AC Load n) also draw power by connecting the AC Bus 2 (106). Further, electrical power system 100 may lave one or more motors 120 running on the power supplied on AC Bus 2 (106).

The electrical power system 100 can be, for example, implemented as an aircraft electrical system. Aircrafts or the like systems are powered on an electrical system at a frequency of 400-Hz rather than 60-Hz as a result of the tradeoffs between the fact that the power supplies tend to be smaller in size and lighter in weight, both of which are important as aircraft space is limited and weight minimization is always of significance. Operating at a higher frequency 400-Hz, generators 102 supply power of 120 kVA/ 115 Vac. Some generators 102 are driven by aircraft engines and some by auxiliary power units (APUs). In addition, a 3-Phase 400-Hz electrical power system further provides for a smaller and fewer filtering components required for rectifying AC supplies to DC supplies. In some aircrafts, additional backup power supplies such as batteries are also provided in cases where the afore-mentioned electrical sources fail or where to provide power in an emergency. While these electrical power sources supply AC power of 115 volts at 400-Hz; rectifiers usually further converts such AC power to DC power of 28 volts at 400-Hz.

Figure 2:
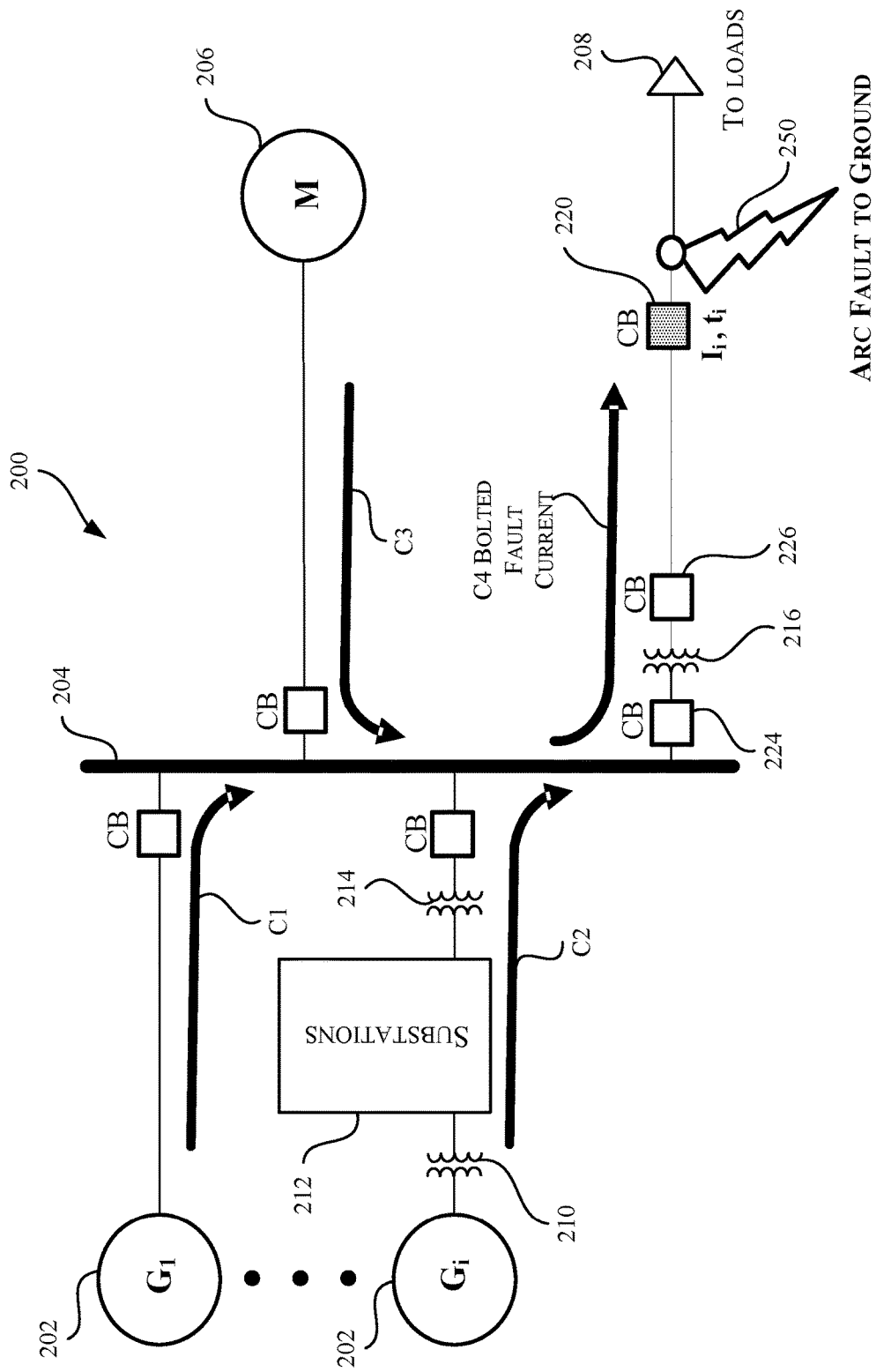
FIG. 2 illustrates a single line schematic view of an example of an arc fault on the load side of an example of an electrical power system operating at 400-Hz, in accordance with one or more embodiments of the present disclosure.

FIG. 2 illustrates a single line schematic view of an example of an arc fault in a simplified example of a 400-Hz electrical power system, according to one or more embodiments of the present disclosure. For the purpose of simplicity, only one bus line 204 is shown in 400-Hz electrical power system 200, which includes a plurality of generators 202 ($G_1$, . . . , $G_i$) as power sources. As shown herein, some generators ($G_1$) connect via a circuit breaker (CB) directly to bus line 204, some generators ($G_i$) connect through transformer 210 to one or more substations 212, which in turn connect through transformer 214 and circuit breaker (CB) to bus line 204. Functions similar to CB may also be provided by equipment such as, but not limited to, fuses, relays, contactors and other switchgear. As described here and in below, the use of a circuit breaker is only for the purpose of illustrating an example of a protection function and not as a specific protection device. On the load side, one or more motors 206 connect to bus line 204 through a circuit breaker (CB) as well. Further, multiple loads 208 also connect to bus line 204 through circuit breaker 220, which connects downstream to a transformer 216 protected by circuit breakers 224 and 226.

As shown herein, current C1 flows from the plurality of generators 202 through CB to bus 204. Similarly, current C2 flows from substations 212 to bus 204 as well. In some scenarios, one or more motors 206 nevertheless generate back current C3 that is capable of flowing onto bus 204. Consequently, the cumulative effect of currents C1, C2 and C3 contributes to a bolted fault current C4 flowing through the series of circuit breaker 224, transformer 216 and circuit breaker 226, causing CB 220 to trip in to a disconnected state (shown as a shaded box), and an arc fault 250 to occur from line to ground and near the portion of load side circuitry protected by circuit breaker 220.

Even though only an arc fault to ground is shown herein, like other types of electrical faults, arc faults may occur in a variety of manners, for example, line to line, line to line to ground, etc. Arc faults may also occur symmetrically or asymmetrically. At a symmetrical arc fault event, all three phases are affected equally; while at an asymmetrical arc fault event, each of the phases is affected in a different magnitude than the other. In some embodiments, arc flash current is modeled under an assumption of the electrical arc being symmetrical since a symmetrical arc tends to generate maximum current. Furthermore, arc faults can also occur at a variety of points within the electrical power system, for example, an arc flash can be detected on the power generating side as well. It is for the purpose of simplicity that only one scenario that leads to electrical arcing and one arcing point is illustrated herein as a simplified example.

Figure 3:
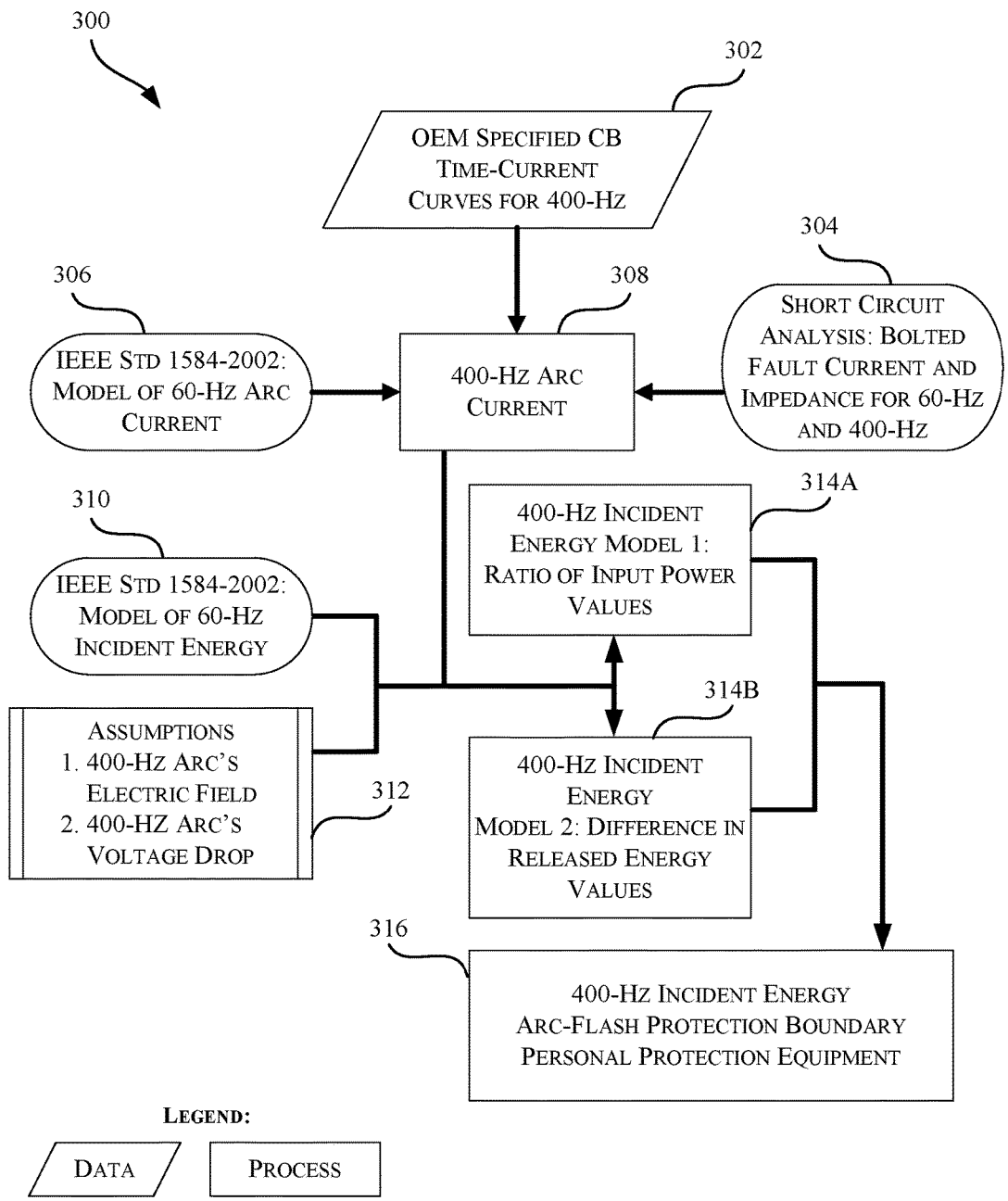
FIG. 3 is an example block diagram illustrating high level steps for arc flash analysis, in accordance with one or more embodiments of the present disclosure.

FIG. 3 shows an example flowchart 300 illustrating the high level steps for arc flash hazard analysis and determination, in accordance with one or more embodiments of the present disclosure. The detailed steps of these general steps are further described in FIGS. 4A, 4B, 5 and 6. At step 302, time-current curves are obtained by use of, for example, OEM specifications. Such curves may be utilized to determine the value of both the trip time and trip current of a protection equipment such as a circuit breaker, a fuse or the like within a 400-Hz system. This step is further described below in steps 404 and 406 of FIG. 4A, as well as in FIG. 4B. At step 304, the values of bolted fault current and impedance are obtained for both a 60-Hz system and a 400-Hz system. At step 306, a magnitude value of 60-Hz arcing current can be calculated by use of the IEEE Standard 1584-2002 formula. At step 308, the time-current values, bolted fault current and impedance values, as well as the 60-Hz arcing current values are utilized to calculate the value of an arcing current at 400-Hz. This step is further described in below in the steps of FIG. 4A.

Subsequent to an arcing current at 400-Hz is determined at step 308, flowchart 300 continues to model and calculate a value of incident energy released by the arc flash. At step 310, a value of arc flash incident energy at 60-Hz is determined by use the IEEE Standard 1584-2002 formula, with assistance of the assumptions with regard to the relationship between an 400-Hz arc and a 60-Hz arc, as highlighted in step 312. In particular, in some embodiments, a first assumption may be made with respect to the characteristics of the electric field of a 400-Hz arc; and a second assumption may be made with respect to the characteristics of a voltage drop of a 400-Hz arc. The details of these assumptions are further described in below in the steps of FIG. 6.

As indicated by the double arrowed connector between steps 314A and step 314B, steps 314A and 314B are alternative embodiments of modeling and calculating a value of arc incident energy in accordance with one or more embodiments of the present disclosure. At step 314A, 400-Hz arc incident energy is modeled as a function of a ratio of values of power input into a 400-Hz arc and a 60-Hz arc. At step 314B, 400-Hz arc incident energy is modeled as a function of a difference between the values of 400-Hz arc incident energy and 60-Hz arc incident energy. Again, the details of steps 314A-B are further described in below in the steps of FIG. 6.

After a value of an arc incident energy is modeled and calculated as above-described, in various embodiments, the value of 400-Hz arc incident energy may provide the basis to analyze or assess the arc flash hazards in order to provide for worker protection and workspace safety in compliance with the OSHA regulations. In some embodiments, an arc flash protection boundary is determined at step 316 by use of the value of an arc incident energy. In some other embodiments, a risk category is determined based on both the value of the 400-Hz arc incident energy and the National Fire Protection Association (NFPA)-70E guidelines such that a level of Personal Protection Equipment (PPE) is determined based thereon. In yet some other embodiments, warning labels can be printed with verified or updated or certified power safety information such as the afore-described risk level of potential arc hazards and the level of Personal Protection Equipment (PPE) determined for the analyzed electrical equipment. The label can be further affixed to the electrical equipment analyzed as part of the workplace safety practice for energized electrical systems. The details of these applications of the value of arc incident energy are further described in below in the steps of FIG. 6.

Figure 4A:
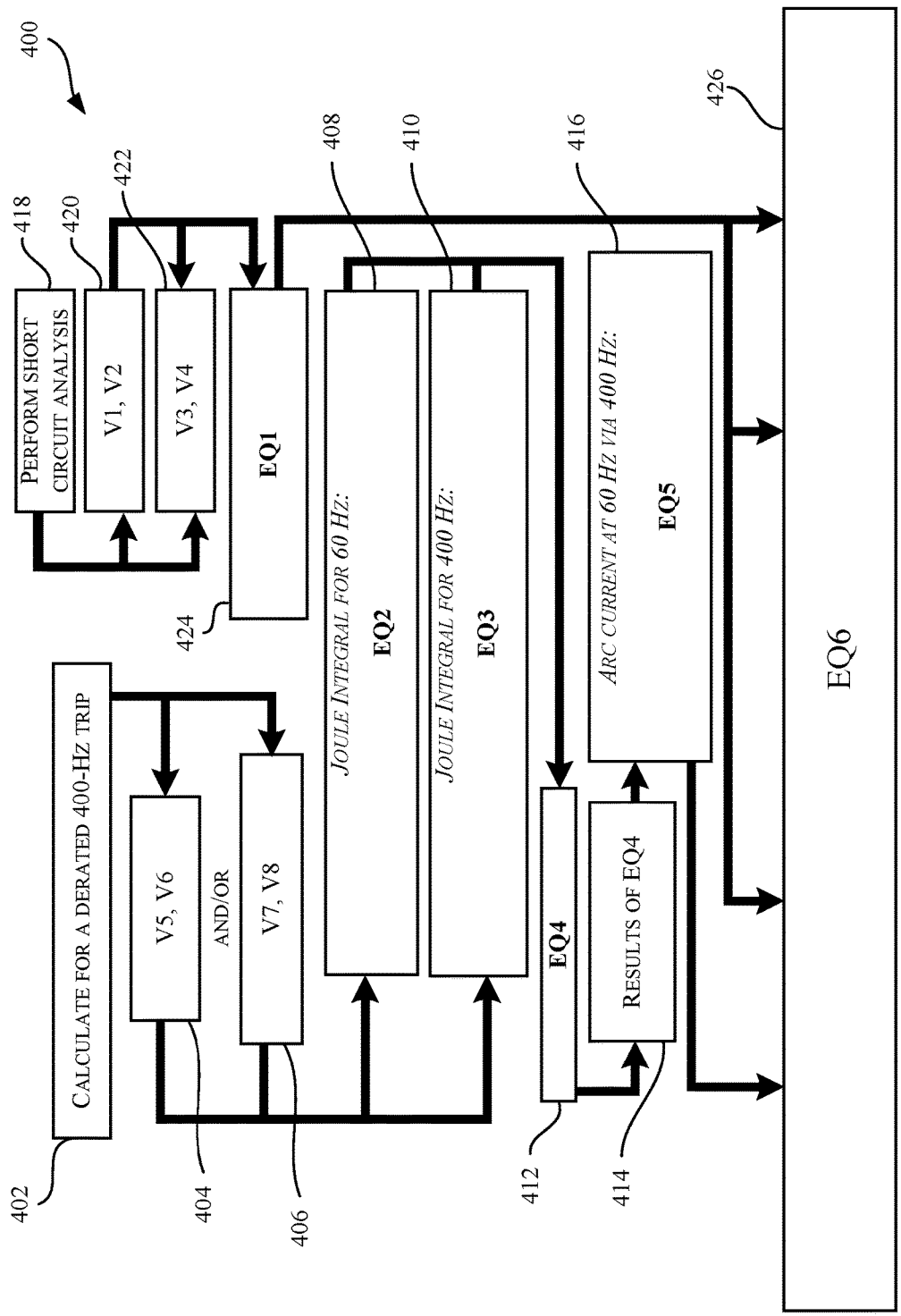
FIG. 4A is an example flowchart illustrating an example method for arc flash current determination, in accordance with one or more embodiments of the present disclosure.

FIG. 4A illustrates an example method 400 for determining the magnitude value of an arcing current occurring in a 400-Hz electrical power system, in accordance with one or more embodiments of the present disclosure. Here, a circuit breaker that is rated for operation in a 60-Hz electrical power system is utilized as an example of a protection equipment in the 400-Hz electrical power system. Because of the increased resistance of the copper sections resulting from the skin effect produced by eddy currents at 400 Hz, when a circuit breaker rated at 60-Hz is used to protect the 400-Hz system, the circuit breaker typically needs derating in order to function properly at the higher frequency. In some embodiments, the derating factors ($f_t$) for the trip current and corresponding trip time are supplied by the circuit breaker manufacturer. In some embodiments, these derating factors ($f_t$) can be determined by testing the circuit breaker in experiments for use at 400-Hz. In some embodiments, a relation between a trip time at 60-Hz and a trip time at 400-Hz can be established by use of the derating factor $f_t$ in the following equation: $t_{d400}=f_t t_{d60}$, where $f_t$ can be determined from a function of the operating frequency or as from above-described embodiments. In some embodiments, the trip time shall be treated as the arc time for a particular value of the arc current. Thus, in such embodiments, the equation can be written as: $t_{a400}=f_t t_{a60}$.

At step 402, the circuit breaker, capable of operation in both a 60-Hz and a 400-Hz electrical system, is derated for a 400-Hz trip in order to determine the trip current and corresponding trip time for protective operation at 400-Hz. In some embodiments, the trip current is the instantaneous trip current. As further described in details in below in FIG. 43, at step 404, values of V5 and V6 are determined, with V5 corresponding to the trip current ($I_{i60}$) for the circuit breaker operating in a 60-Hz system and V6 corresponding to the trip current ($I_{i400}$) for the circuit breaker operating in a 400-Hz system. Also as further described in details in below in FIG. 4B, at step 406, values of V7 and V8 are determined, with V7 corresponding to the trip time ($t_{a60}$) for the circuit breaker operating in a 60-Hz system and V8 corresponding to the trip time ($t_{a400}$) for the circuit breaker operating in a 400-Hz system.

At step 418, a short circuit analysis is performed to obtain the values of V1 and V2 at step 420 as well as the values of V3 and V4 at step 422 at a short circuit point for a 60-Hz and 400-Hz electrical power system, respectively. V1 corresponds to the bolted fault currents ($I_{bf60}$) and V2 corresponds to the equivalent impedance ($Z_{bf60}$) for the circuit breaker operating at 60-Hz, while V3 corresponds to the bolted fault currents ($I_{bf400}$) and V4 corresponds to the equivalent impedance ($Z_{bf400}$) for the circuit breaker operating at 400-Hz. Such a short circuit point under analysis can be any equipment susceptible to an arc flash event in the electrical power system. In some embodiments, the arc flash vulnerable points can be protection devices such a fuse, a circuit breaker, a switch, or the like. In some embodiments, short circuit currents and equivalent impedance are calculated at each of the main bus line, branch bus lines and load bus lines for the purposes of arc flash hazard assessment.

Short circuit analysis can be performed by use of various calculation algorithms set forth by a number of industrial standards, two widely adopted approaches of which are the American National Standards Institute (ANSI) C37.5-1979 Standard (hereinafter, the ANSI C37.5 Standard) and the International Electrotechnical Commission (IEC) 60909-2001 Standard (hereinafter, the IEC 60909 Standard). For example, according to the ANSI 037.5 Standard, the short circuit current, symmetrical and/or asymmetrical, ANSI X/R ratio and ANSI multiplying factors can be calculated. For another example, according to the IEC 60909 Standard, the symmetric short circuit current, the asymmetric short circuit, the peak short circuit current, and the first cycle short circuit current can be calculated.

In some embodiments, the above-described short circuit analysis can be performed by use of a short circuit software program. Such short circuit analysis programs are configured with the required knowledge of the topology of the electrical system under analysis, options with regard to the various short circuit calculation methods as described herein above, options with regard to calculate an equivalent impedance; as well as options reporting the result data of the short circuit analysis.

In some embodiments, a difference between the one bus away from a location of the fault voltages in the systems operating at 60-Hz and 400-Hz is calculated as $\delta V = V_{s60}/V_{s400}$ and at step 424. $I_{bf60}$ can be expressed in relation to $I_{bf400}$ by the equation EQ1:

$$I_{bf60} = \delta V \frac{|Z_{bf400}|}{|Z_{bf60}|} I_{bf400}.$$

Next, at step 408, a Joule Integral (JI) or $I^2 t$ ($S_{a60}$) value is calculated by use of the value of the trip current $I_{i60}$ and corresponding trip time $t_{a60}$ obtained for the 60-Hz system to model the amount of power input into the 60-Hz arc. For example, in the case of a symmetrical fault, a value of JI can be calculated by the equation EQ2:

$$S_{a60} = \frac{I_{i60}^2}{2}\left(t_{a60} - \frac{1}{2\omega}\sin[2\omega t_{a60}]\right) = \alpha_{60}\frac{I_{i60}^2}{2}.$$

Similarly, at step 410, a Joule Integral (JI) or $I^2 t$ value ($S_{a400}$) is calculated by use of the value of the trip current $I_{i400}$ and corresponding trip time $t_{a400}$ for the 400-Hz system to model the amount of power input into the 400-Hz arc. For example, a value of JI can be calculated by the equation EQ3:

$$S_{a400} = \frac{I_{i400}^2}{2}\left(t_{a400} - \frac{1}{2\omega}\sin[2\omega t_{a400}]\right) = \alpha_{400}\frac{I_{i400}^2}{2}.$$

At step 412, given a difference in the values of $S_{a60}$ and $S_{a400}$ captured as EQ4: $\Delta S = S_{a400} - S_{a60}$. $S_{a400}$ can be expressed in relation to $S_{a60}$ in the equation $S_{a400} = S_{a60} + \Delta S$. As shown at step 414, regardless whether the value of $\Delta S$, i.e., the result of EQ4, is equal to, greater or less than 0, $\Delta S$ is utilized to calculate, at step 416, a value of arc current at 60-Hz in relation to a value of arc current at 400-Hz by the equation EQ5:

$$I_{a60} = \left[\frac{\alpha_{400}}{\alpha_{60}}\right]^{1/2} \sqrt{I_{a400}^2 - \frac{2\Delta S}{\alpha_{400}}}.$$

Lastly, at step 426, according to the IEEE Standard 1584-2002 formula, a value of bolted fault current $I_{bf}$ at 60-Hz can be utilized to calculate a value of arcing current $I_a$ at 60-Hz. As shown in step 418, from which the value of $I_{bf60}$ is calculated from step 424, the value of $I_{a60}$ calculated from step 416 is plugged into the IEEE empirical formula such that the value of $I_{a400}$ can be expressed in relation to $\Delta S$, $I_{bf60}$, $I_{bf400}$, $Z_{bf60}$ and $Z_{bf400}$ in the IEEE Standard 1584-2002 formula, which is specified as the following equation EQ6:

$$lgI_a = K + 0.662 lgI_{bf} + 0.0966V + 0.000526G + 0.5588V \\ (lgI_{bf}) - 0.00304G(lgI_{bf})$$

for V<1 kV; and $$lgI_a = 0.00402 + 0.983 lgI_{bf}$$

for V>1 kV.

In particular, a value of an arcing current at 60-Hz can be calculated by the equation $$I_{a60} = 10^{\beta_1} I_{bf60}^{\beta_2} \quad (1a)$$

where, for V<1 kV, $\beta_1 = K + 0.0966V + 0.000526G$; and $\beta_2 = 0.662 + 0.5588V - 0.00304G$. For V>1 kV, $\beta_1 = 0.00402$; and $\beta_2 = 0.983$. K is specified in the IEEE Standard 1584-2002.

The equation (1a), expressed by the $I_{bf60}$ calculated from step 424 and $I_{a60}$ from step 416, is the following:

$$\left[\frac{\alpha_{400}}{\alpha_{60}}\right]^{1/2} \sqrt{I_{a400}^2 - \frac{2\Delta S}{\alpha_{400}}} = 10^{\beta_1}\left(\delta V \frac{|Z_{bf400}|}{|Z_{bf60}|} I_{bf400}\right)^{\beta_2} \quad (2)$$

From the above-illustrated equation (2), a value of an arc current $I_{a400}$ at 400-Hz is calculated by the equation:

$$I_{a400} = \sqrt{\left[\frac{\alpha_{60}}{\alpha_{400}}\right] 10^{2\beta_1}\left(\delta V \frac{|Z_{bf400}|}{|Z_{bf60}|} I_{bf400}\right)^{2\beta_2} + \frac{2\Delta S}{\alpha_{400}}} = \\ \sqrt{\left[\frac{\alpha_{60}}{\alpha_{400}}\right] 10^{2\beta_1} I_{bf60}^{2\beta_2} + \frac{2\Delta S}{\alpha_{400}}} \quad (3)$$

Figure 4B:
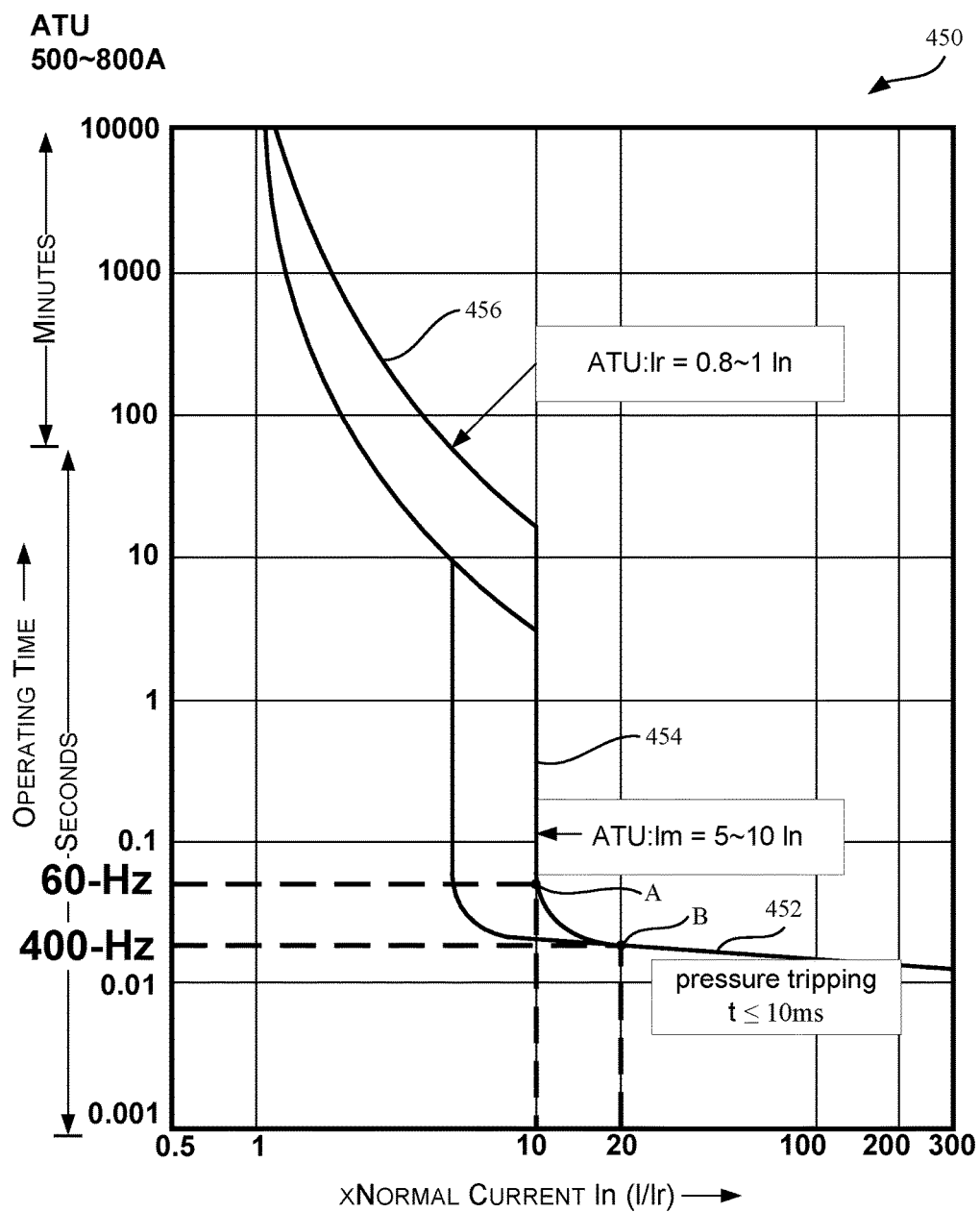
FIG. 4B is an example of a graphical presentation of a trip curve illustrating the protection provided by an example circuit breaker for operation in both a 60-Hz and a 400-Hz electric power systems, in accordance with one or more embodiments of the present disclosure.

FIG. 4B illustrates a graph 450 of generalized trip curve for an example circuit breaker such as circuit breaker 220 of FIG. 2, in accordance with one or more embodiments of the present disclosure. In various embodiments, the example circuit breaker can be any type of circuit breaker suitable for protective operation in both a 60-Hz and 400-Hz electrical systems. In some embodiments, the circuit breaker is an adjustable thermal and adjustable magnetic trip unit, which can be configured with settings of a number of overload current ratings, as well as a number of instantaneous or short circuit current ratings.

In general, the circuit breaker configuration information such as rated current, rated frequency, interrupting capacity, maximum voltage, operating ambient temperature, as well as instantaneous current are marked and/or described in its manufacturer manual or specifications. Thus, for the circuit breaker rated for operating at 60-Hz, its trip current at 60-Hz ($I_{a60}$) can be retrieved from its configuration information provided by the manufacturer. In some embodiments, the trip current is the instantaneous trip current. In this example as shown herein, an adjustable thermal and adjustable magnetic circuit breaker of rated current of 800 Amps for use at 50-60-Hz is configured with a setting of an instantaneous trip current of 8000 Amps. As described herein above, the derating factors for operating a circuit breaker at 60-Hz for use at 400-Hz can be determined in various manners. In this example, information regarding the derating factor for the rated operational current, the derating factor for the trip current, and the like are supplied by the circuit breaker's manufacturer manual or specifications. As shown in FIG. 4B, the circuit breaker's instantaneous current at 400-Hz ($I_{i400}$) is set as twice the magnitude of the instantaneous current at 60-Hz, i.e., 16000 Amps.

As shown in FIG. 43, the trip curve, also known as time-current curve, is a logarithmic plot of per unit current on the x-axis and time in seconds on the y-axis. Typically, the per unit current is normalized to the rated current ($I_r$) of the circuit breaker. When plotted on the log-log scale, the trip curve comprises a number of line segments. The segment 452 represents the instantaneous response time of the breaker which is a function of the mechanical limitations of the mechanism, such as a pressure tripping. Segment 456 indicates the delayed trip in response to overload currents that persist and are tolerated by the circuit breaker over a period of time. Segment 454 is the instantaneous trip current by which the circuit breaker responds immediately to very high overload currents, such as a short circuit fault current. As described herein above, the instantaneous trip current $I_{i60}$ is 8000 Amps, i.e., ten (10) times of the current rated (800 Amps) for the circuit breaker, i.e., in this example, the instantaneous trip current $I_{i60}$ is 10 per unit.

With the determination of $I_{i60}$ and $I_{i400}$, the corresponding trip times $t_{a60}$ and $t_{a600}$ can be determined by use of the trip curve of graph 450. As shown in FIG. 4B, the coordinates for the left hand point of segment 452, and the coordinates for the lower point of segment 454, are the instantaneous trip current and the minimum trip time for the circuit breaker. The coordinates for the upper point of segment 454 are the instantaneous trip current and the maximum trip time. Thus, in this example, the point A indicates on the y-axis the trip time corresponding to the instantaneous trip current at 10 per unit as about 50 milliseconds, which is the corresponding trip time ($t_{a60}$) for the circuit breaker application in a 60-Hz system. As described herein above, with the instantaneous trip current at 400-Hz being specified as twice (2) the value of the instantaneous trip current at 60-Hz, the point B indicates the 400-Hz instantaneous trip current as about 20 per unit, and the corresponding trip time ($t_{a400}$) on the y-axis as about 19.5 milliseconds, for the circuit breaker application in a 400-Hz system.

Figure 5:
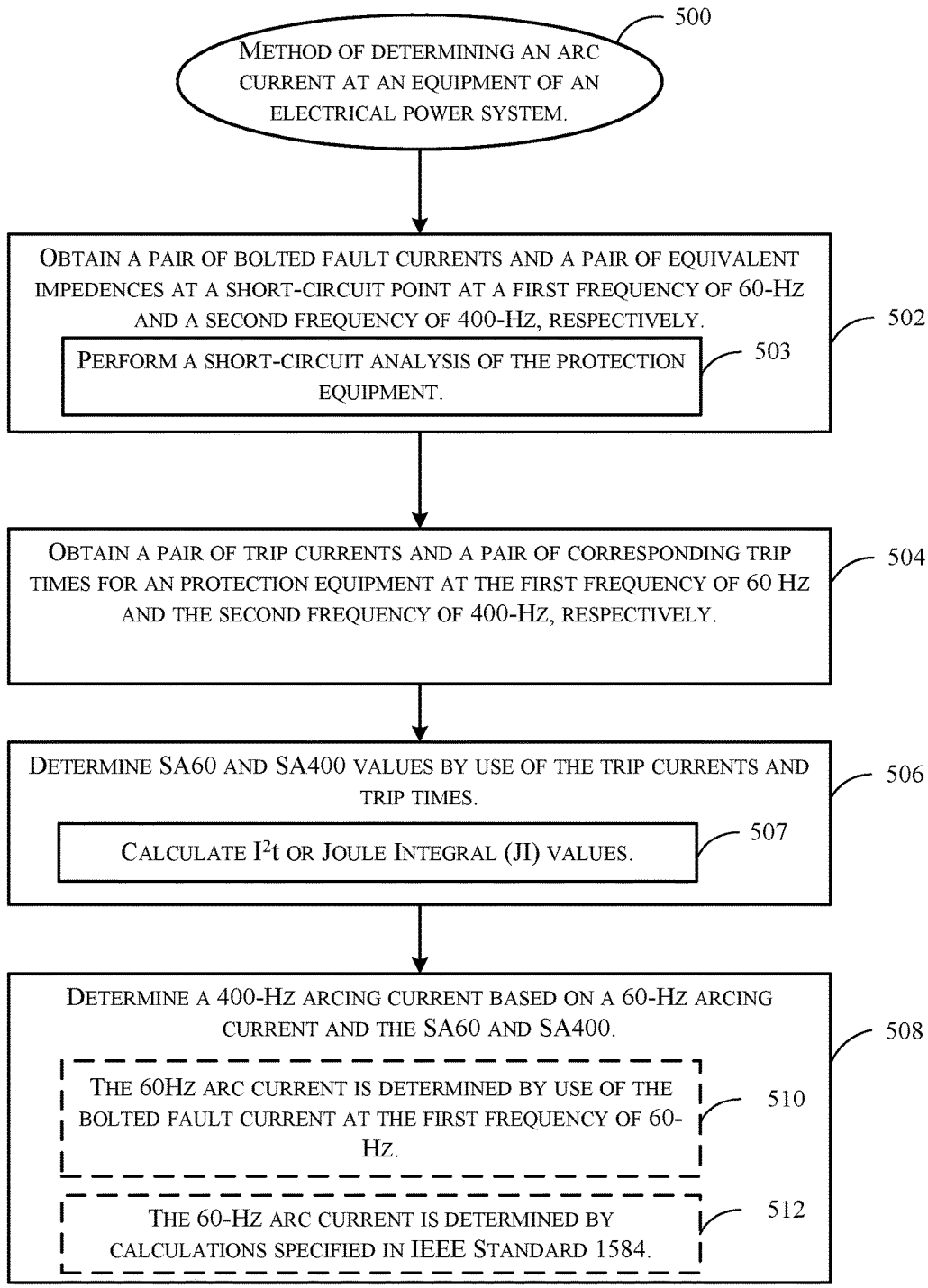
FIG. 5 is an example flowchart illustrating an example method for modeling arc current, in accordance with one or more embodiments of the present disclosure.

FIG. 5 illustrate an example method 500 for determining an arc current at an equipment of an electrical power system, in accordance with one or more embodiments of the present disclosure. At step 502, a pair of bolted fault currents and a pair of equivalent impedances at a short circuit point at a first frequency of 60-Hz and a second frequency of 400-Hz are determined respectively. In some embodiments, the aforementioned pair of bolted fault currents and equivalent impedances are obtained by, for example, performing a short circuit analysis of the equipment (step 503). At step 504, a pair of trip currents and a pair of corresponding trip times for a protection equipment are obtained at the first frequency of 60-Hz and the second frequency of 400-Hz, respectively. In some embodiments, the trip current is the instantaneous trip current. In various embodiments, such a protection equipment can be a circuit breaker, a fuse, a switchgear, or the like that is capable of protecting the electrical power system by isolating an electrical fault, e.g., an arc fault, occurring therein.

At step 506, by use of the trip currents and trip times obtained at step 504, a pair of SA60 and SA400 for the equipment are determined, with SA60 corresponding a Joule Integral (JI) or ampere squared seconds ($I^2t$) value calculated at step 507 for the first frequency of 60-Hz, and SA400 corresponding to a Joule Integral (JI) or ampere squared seconds ($I^2t$) value also calculated at step 507 for the second frequency of 400-Hz. At step 508, a value of the magnitude of 400-Hz arcing current is determined based on the afore-obtained Joule Integrals or $I^2t$ values, as well as a value of the magnitude of 60-Hz arcing current. In some embodiments, at step 510, the value of the magnitude of 60-Hz arcing current is determined by use of the bolted fault current at first frequency of 60-Hz. In some embodiments, at step 512, the value of the magnitude of 60-Hz arcing current is determined by calculations specified in the IEEE Standard 1584. In some embodiments, the value of the magnitude of 60-Hz arcing current is calculated by the above-described equation (3) as illustrated with regard to FIG. 4A.

Figure 6:
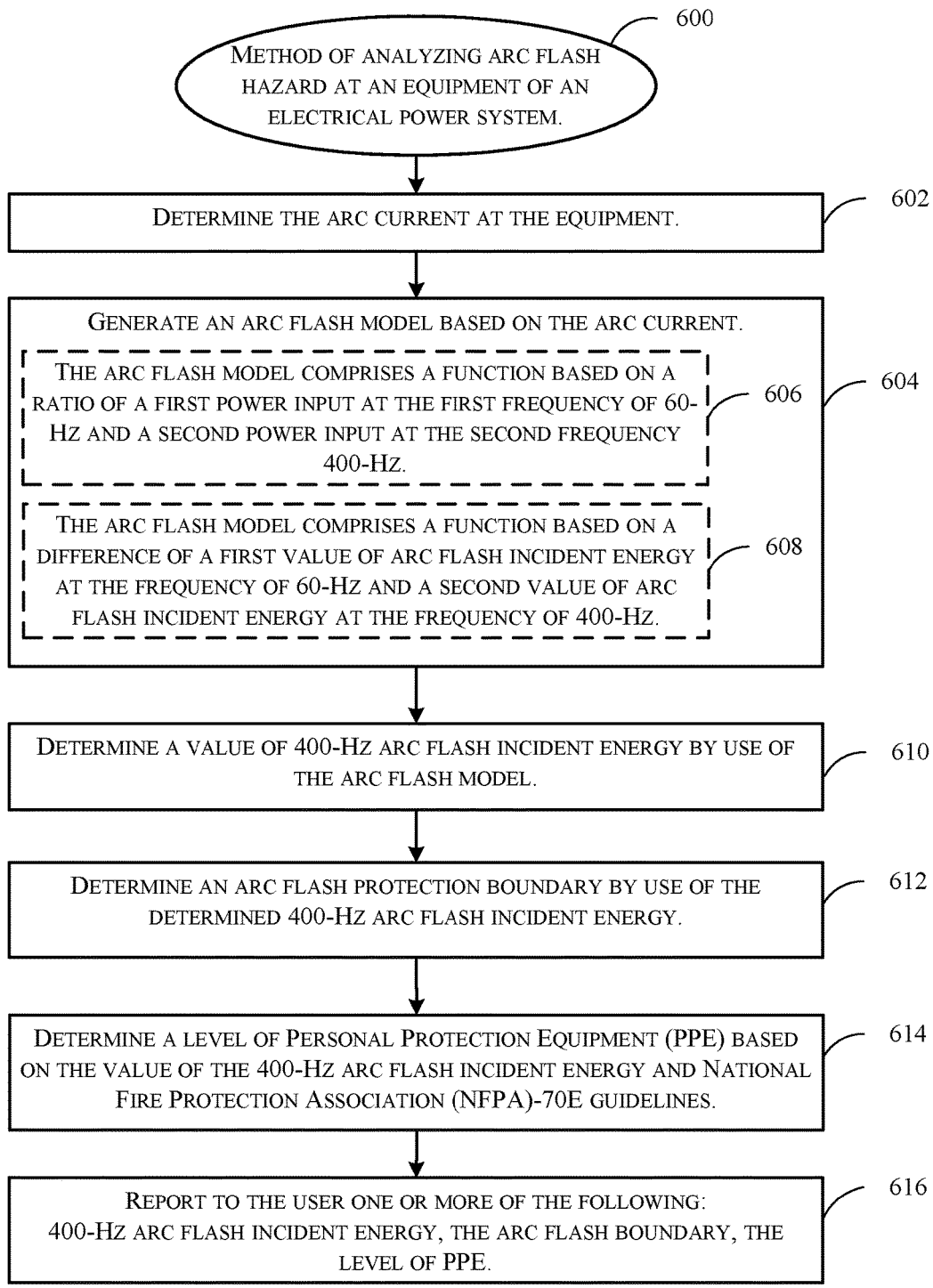
FIG. 6 illustrate an example flowchart showing an example method for analyzing arc flash hazards, in accordance with one or more embodiments of the present disclosure.

FIG. 6 illustrate an example method 600 for analyzing arc flash hazards at an equipment of an electrical power system, in accordance with one or more embodiments of the present disclosure. At step 602, an arc current at the equipment is determined. At step 604, an arc flash model is generated based on the obtained value of magnitude of arc current. In some embodiments, the steps to calculate the value of 400-Hz arcing current is the same as the steps described in FIGS. 4A and/or 5.

In order to model arc flash incident energy at 400-Hz based on the arc current at 400-Hz, characteristics of an arc flash at 400-Hz are determined relative to those of an arc flash at 60-Hz. In various embodiments, unlike the modeling of 60-Hz arc incident energy specified in the IEEE Standard 1584, which is compiled based on a large amount of empirical data, assumptions are needed in order to correlate the relationship between the incident energy of a 400-Hz arc flash and a 60-Hz arc flash. In some embodiments, it can be assumed that the intensity of an electric field ($F_{a60}$) inside of an arc at 60-Hz remains as a constant, which is expressed by the equation $F_{a60}=1,200–1,500$ V/m. Further, it can also be assumed that the voltage of an arc is a function of $V_0 \times \text{sgn}(I_{arc})$, where the arc voltage plateaus at a constant value $V_0 \times F_0 \times G$ when $I_{arc}>0$, and at $-V_0$ when $I_{arc}<0$. In both cases, G is the length of the air gap of the arc. Furthermore, it can also be assumed that the ratio of the electric field intensity inside a 60-Hz arc in the air and a 400-Hz arc in the air is similar as a ratio of electric field intensity of those arcs in vacuum. For example, $F_{a400}/F_{a60}=A_f$. Furthermore, it can also be assumed that the root means square (RMS) values of R and I can be utilized to determine the amount of input power (heat generated) by equation $P=R_{aRMS} \times I_{aRMS}^2$.

Given those above-described assumptions, a value of arc incident energy at 400-Hz can be modeled in various embodiments. In some embodiments, at step 606, the arc flash model comprises a function based on a ratio ($\varepsilon$) of a first power input at the first frequency 60-Hz and a second power input at the second frequency 400-Hz. In some embodiments, the first value of arc flash incident energy is determined by calculations specified in the Institute of Electrical and Electronic Engineers (IEEE) standard 1584. In order to determine the ratio, in some embodiments, an average amount of power input over a period of time $t_0$ to an arc (heat generated) is first calculated by the equation:

$$P_{av} = R_{aRMS} I_{aRMS}^2 = \quad (4)$$
$$\frac{1}{t_0}\int_0^{t_0} u_a(t)i_a(t)dt = \frac{1}{t_0}\int_0^{t_0} U_a \text{sgn}[i(t)] \times i(t)dt \approx \frac{2F_a G I_{amax}}{\pi t_0}\left[t_0 - \frac{\sin(2\omega t_0)}{6\omega}\right] = \frac{2U_a I_{amax}}{\pi t_0}\left[t_0 - \frac{\sin(2\omega t_0)}{6\omega}\right]$$

Then, the ratio ($\varepsilon = E_{n400}/E_{n60}$) of the heat generated for an arc at 400-Hz and an arc 60-Hz can be calculated by the equation:

$$\varepsilon = \frac{R_{aRMS400} I_{aRMS400}^2 f_{a400}}{R_{aRMS60} I_{aRMS60}^2 f_{a60}} = \frac{F_{a400} I_{a400}}{F_{a60} I_{a60}} \approx A_f \frac{I_{a400}}{I_{a60}} \quad (6)$$

Noting that the above-calculated input power ratio applies to the normalized incident energy $E_{n400}$ and $E_{n60}$ as:

$$E_{n400}/E_{n60} = \varepsilon \quad (7)$$

Therefore, the normalized arc incident energy $E_{n400}$ at 40-Hz is calculate by the equation:

$$E_{n400} = \varepsilon 10^{\gamma_1}(I_{a60})^{\gamma_2} \approx 2*10^{\gamma_1} I_{a400}^{\gamma_2} I_{a60}^{\gamma_2-1} \quad (8)$$

where $\gamma_1 = K_1 + K_2 + 0.0011G$, $\gamma_2 = 1.081$, and $K_1$ and $K_2$ are specified according to the IEEE Standard 1584-2002.

Furthermore, as the above-described normalization is by 0.2 second of arc duration time and from a distance of 610 mm from the arc, at step 610, the full amount of arc incident energy $E_{400}$ at 400-Hz can be calculated by the equation:

$$E_{400} = 6.276 E_{n400}\left(\frac{t}{0.2}\right)\left(\frac{610}{D}\right)^x, \text{ when } V < 1 \text{ kV; and} \quad (9a)$$

$$E_{400} = 4.184 E_{n400}\left(\frac{t}{0.2}\right)\left(\frac{610}{D}\right)^x, \text{ when } V > 1 \text{ kV.} \quad (9b)$$

Accordingly, at step 612, an arc flash protection boundary distance in millimeters at 400-Hz can be calculated by the equation:

$$D_{400} = \sqrt{6.276 E_{n400}\left(\frac{t}{0.2}\right)\left(\frac{610^x}{E_B}\right)} \text{ [mm]}, \quad (10a)$$

when $V < 1$ kV; and $$D_{400} = \sqrt{4.184 E_{n400}\left(\frac{t}{0.2}\right)\left(\frac{610^x}{E_B}\right)} \text{ [mm], when } V > 1 \text{ kV.} \quad (10b)$$

In some other embodiments, at step 608, the arc flash model comprises a function based on a difference ($\Delta E$) of a first value of arc flash incident energy at the frequency of 60-Hz and a second value of arc flash incident energy at the frequency of 400-Hz. In other words, the value of arc incident energy at 400-Hz can be expressed as $E_{400}=E_{60}+\Delta E$. In some other embodiments, the difference ($\Delta E$) between the values of the arc incident energy $E_{400}$ and $E_{60}$ are first calculated by the equation:

$$\Delta E = \frac{\partial E/\partial I_a}{\partial P/\partial I_a}\Delta P = \varphi \gamma_2 10^{\gamma_1} I_{a400}^{\gamma_2-1}\left(\frac{I_{a400}}{0.2}\right)\left(\frac{610}{D}\right)^2 I_{a60}\left(\frac{\varepsilon}{A_f}-1\right)(A_f-1),$$

if $I_{a400} > I_{a60}$;

$$\Delta E = \frac{\frac{\partial E}{\partial I_a}}{\frac{\partial P}{\partial I_a}}\Delta P = \varphi \gamma_2 10^{\gamma_1} I_{a400}^{\gamma_2-1}\left(\frac{I_{a400}}{0.2}\right)\left(\frac{610}{D}\right)^x I_{a60}\left(1-\frac{\varepsilon}{A_f}\right)(A_f-1)$$

if $I_{a400} < I_{a60}$, where $\varphi=6.276$ when V<1 kV; and $\varphi=4.184$ when V>1 kW.

Accordingly, at step 610, the value of arc incident energy $E_{400}$ can be calculated by the equation:

$$E_{400} = \varphi * 10^{\gamma_1} I_{a60}^{\gamma_2}\left(\frac{I_{a60}}{0.2}\right) \quad (11a)$$
$$\left(\frac{610}{D}\right)^x\left[1+\gamma_2\left(\frac{\varepsilon}{A_f}\right)^{\gamma_2-1}\left(\frac{\varepsilon}{A_f}-1\right)\frac{I_{a400}}{I_{a60}}(A_f-1)\right],$$

when $I_{a400} > I_{a60}$;

$$E_{400} = \varphi * 10^{\gamma_1} I_{a60}^{\gamma_2}\left(\frac{I_{a60}}{0.2}\right) \quad (11b)$$
$$\left(\frac{610}{D}\right)^x\left[1+\gamma_2\left(\frac{\varepsilon}{A_f}\right)^{\gamma_2-1}\left(1-\frac{\varepsilon}{A_f}\right)\frac{I_{a400}}{I_{a60}}\right](A_f-1),$$

when $I_{a400} < I_{a60}$.

Then, a value of arc incident energy normalized by an arc duration time of 0.2 second of and from a distance of 610 mm from the arc flash, can be calculated by the equation:

$$E_{n400} = \frac{E_{400}}{6.276\left(\frac{I_{a400}}{0.2}\right)\left(\frac{610}{D}\right)^x}, \text{ when } V < 1 \text{ kV; and} \quad (13a)$$

$$E_{n400} = \frac{E_{400}}{4.184\left(\frac{I_{a400}}{0.2}\right)\left(\frac{610}{D}\right)^x}, \text{ when } V > 1 \text{ kV.} \quad (13b)$$

With the above-calculated $E_{n400}$ and $E_{n60}$, by use of the above-described equations (10a) or (10b), at step 612, an arc flash protection boundary distance at 400-Hz can be calculated.

As above-described in the use of two arc flash incident energy models, at step 610, a value of 400-Hz arc flash incident energy is determined by use of the arc flash model. At step 612, an arc flash protection boundary is determined by use of the determined 400-Hz arc flash incident energy. Further, at step 614, a level of Personal Protection Equipment (PPE) is determined based on the value of the 400-Hz arc flash incident energy and National Fire Protection Association (NFPA)-70E guidelines.

Under the NFPA-70E guidelines, the NFPA category levels are specified based on the Cal/cm² values of the arc incident energy calculated for an arc flash event in the table re-produced in below:

TABLE 1

| NFPA-70E | | |
|---|---|---|
| Category | Cal/cm² | Clothing |
| 0 | 1.2 | Untreated cotton |
| 1 | 5 | Flame retardant (FR) shirt and FR pants |
| 2 | 8 | Cotton underwear, FR shirt, and FR pants |
| 3 | 25 | Cotton underwear, FR shirt, FR pants, and FR coverall |
| 4 | 40 | Cotton underwear, FR shirt, FR pants, and double-layer switching coat and pants. |

Accordingly, Personal Protection Equipment (PPE) can be determined by deciding the corresponding arc hazard category level and its associated PPE specified in Table 1.

At step 616, one or more of the calculated 400-Hz arc flash incident energy, the arc flash hazard protection boundary, the level of PPE determined at step 612 are reported to a user. In some embodiments, as the OSHA requires certain electrical units to be properly labeled such that to indicate the amount of PPE appropriate for working with the energized electrical units without incurring personal injury due to exposure to potential arching incidents, these arc flash hazard information can be printed out on a label that can be affixed to the electrical unit or equipment tested or assessed. In some other embodiments, by use of system 900 described in below in FIG. 9, these arc flash hazard information can also be stored in the system 900, or reported to a user via a user interface that is not shown in FIG. 9. In some embodiments, the user can be human user; in some other embodiments, the user can be a non-human entity (e.g., another computing system or an AI system) that is interested in obtaining or storing such arc flash hazard analysis nevertheless.

Examples of Aircraft and Methods of Fabricating and Operating Aircraft

Figure 7:
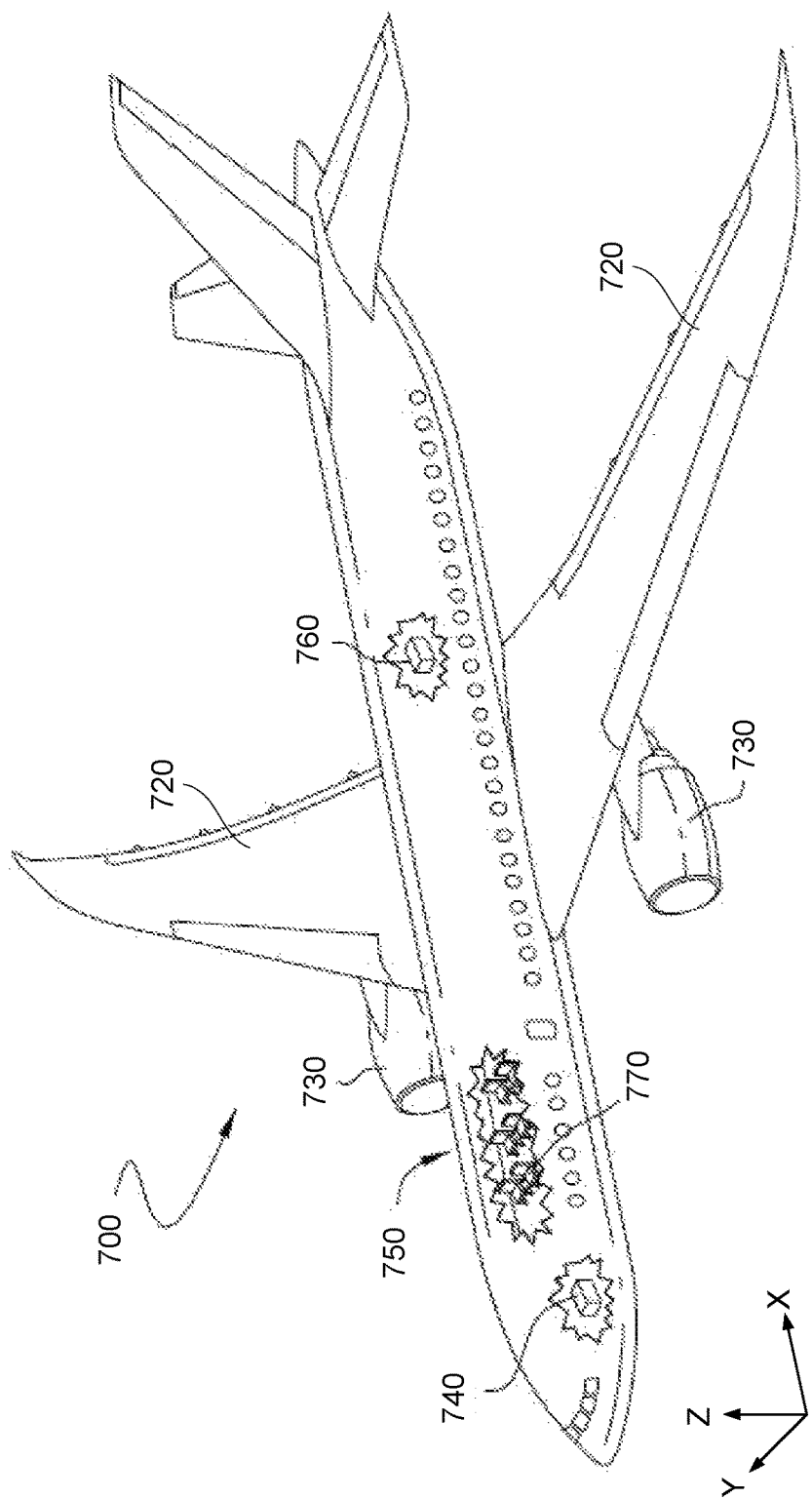
FIG. 7 is a schematic illustration of an aircraft, in accordance with one or more embodiments of the present disclosure.

To better understand various aspects of implementation of the described systems and techniques, a brief description of an aircraft and aircraft wing is now presented. FIG. 7 is a schematic illustration of aircraft 700, in accordance with some embodiments. As depicted in FIG. 7, aircraft 700 is defined by a longitudinal axis (X-axis), a lateral axis (Y-axis), and a vertical axis (Z-axis). In various embodiments, aircraft 700 comprises airframe 750 with interior 770. Aircraft 700 includes wings 720 coupled to airframe 750. Aircraft 700 may also include engines 730 supported by wings 720. In some embodiments, aircraft 700 further includes a number of high-level inspection systems such as electrical inspection system 740 and environmental inspection system 760. In other embodiments, any number of other inspection systems may be included.

Aircraft 700 shown in FIG. 7 is one example of a vehicle of which components may be analyzed, tested, rated, modeled, assessed, or certified by system 900 by implementation of methods 400, 500, and 600, in accordance with illustrative embodiments. Although an aerospace example is shown, the principles disclosed herein may be applied to other industries, such as the automotive industry and electric utility industries. Accordingly, in addition to aircraft 700, the principles disclosed herein may apply to other vehicles, e.g., land vehicles, marine vehicles, space vehicles, etc.

Figure 8:
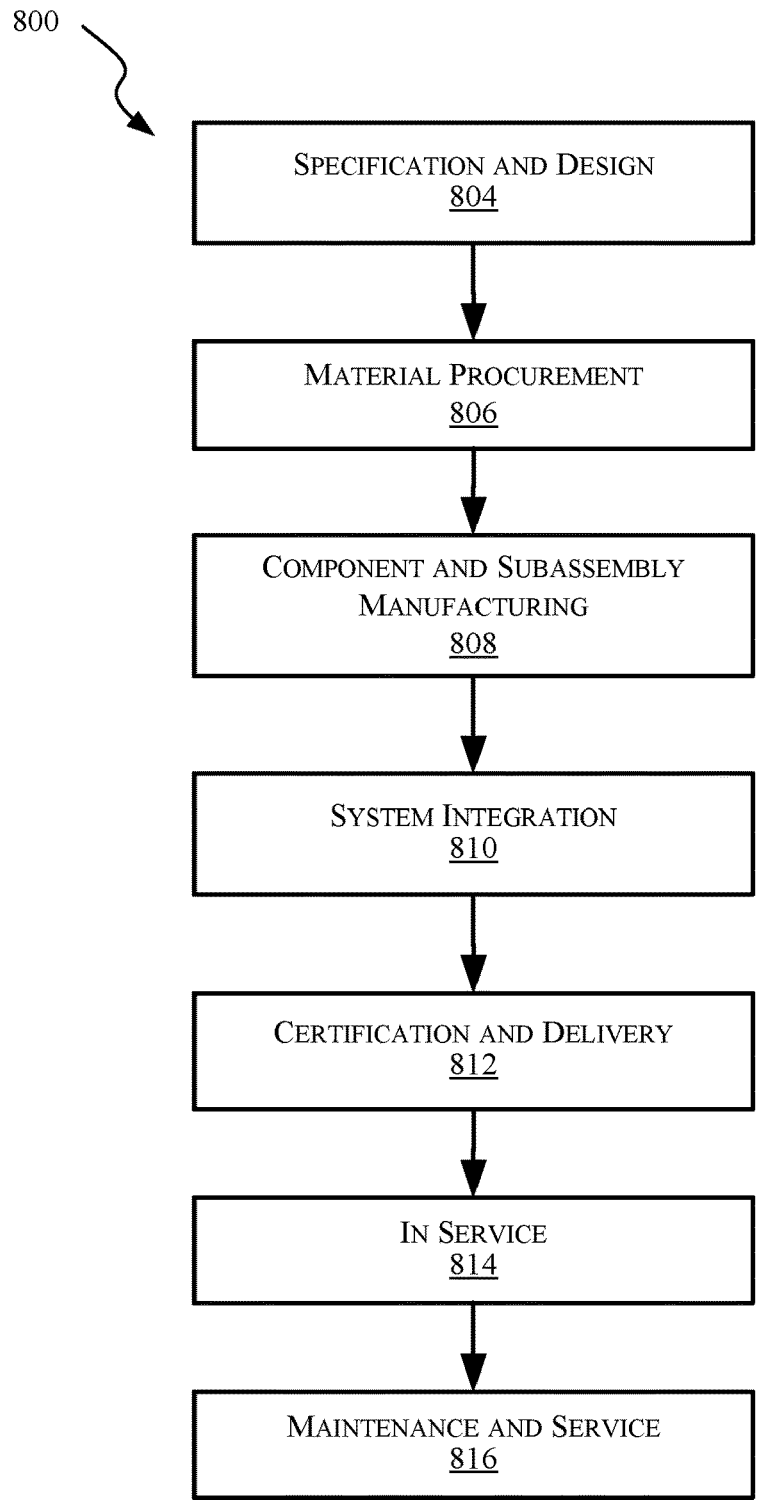
FIG. 8 is a block diagram of aircraft production and service methodology that may utilize methods and assemblies and systems described herein.

Examples of the present disclosure may be described in the context of aircraft manufacturing and service method 800 as shown in FIG. 8 and aircraft 700 as shown in FIG. 7. During pre-production, illustrative method 800 may include specification and design (block 804) of aircraft 700 and material procurement (block 806). During production, component and subassembly manufacturing (block 808) and inspection system integration (block 810) of aircraft 700 may take place. Described methods, and assemblies formed by these methods, can be used in any of specification and design (block 804) of aircraft 700, material procurement (block 806), component and subassembly manufacturing (block 808), and/or inspection system integration (block 810) of aircraft 700.

Thereafter, aircraft 700 may go through certification and delivery (block 812) to be placed in service (block 814). While in service, aircraft 700 may be scheduled for routine maintenance and service (block 816). Routine maintenance and service may include modification, reconfiguration, refurbishment, etc. of one or more inspection systems of aircraft 700. Described methods, and assemblies formed by these methods, can be used in any of certification and delivery (block 812), service (block 814), and/or routine maintenance and service (block 816).

Each of the processes of illustrative method 800 may be performed or carried out by an inspection system integrator, a third party, and/or an operator (e.g., a customer). For the purposes of this description, an inspection system integrator may include, without limitation, any number of aircraft manufacturers and major-inspection system subcontractors; a third party may include, without limitation, any number of vendors, subcontractors, and suppliers; and an operator may be an airline, leasing company, military entity, service organization, and so on.

Apparatus(es) and method(s) shown or described herein may be employed during any one or more of the stages of manufacturing and service method (illustrative method 800). For example, components or subassemblies corresponding to component and subassembly manufacturing (block 808) may be fabricated or manufactured in a manner similar to components or subassemblies produced while aircraft 700 is in service (block 814). Also, one or more examples of the apparatus(es), method(s), or combination thereof may be utilized during production stages (block 808) and (block 810), for example, by substantially expediting assembly of or reducing the cost of aircraft 700. Similarly, one or more examples of the apparatus or method realizations, or a combination thereof, may be utilized, for example and without limitation, while aircraft 700 is in service (block 814) and/or during maintenance and service (block 816).

Figure 9:
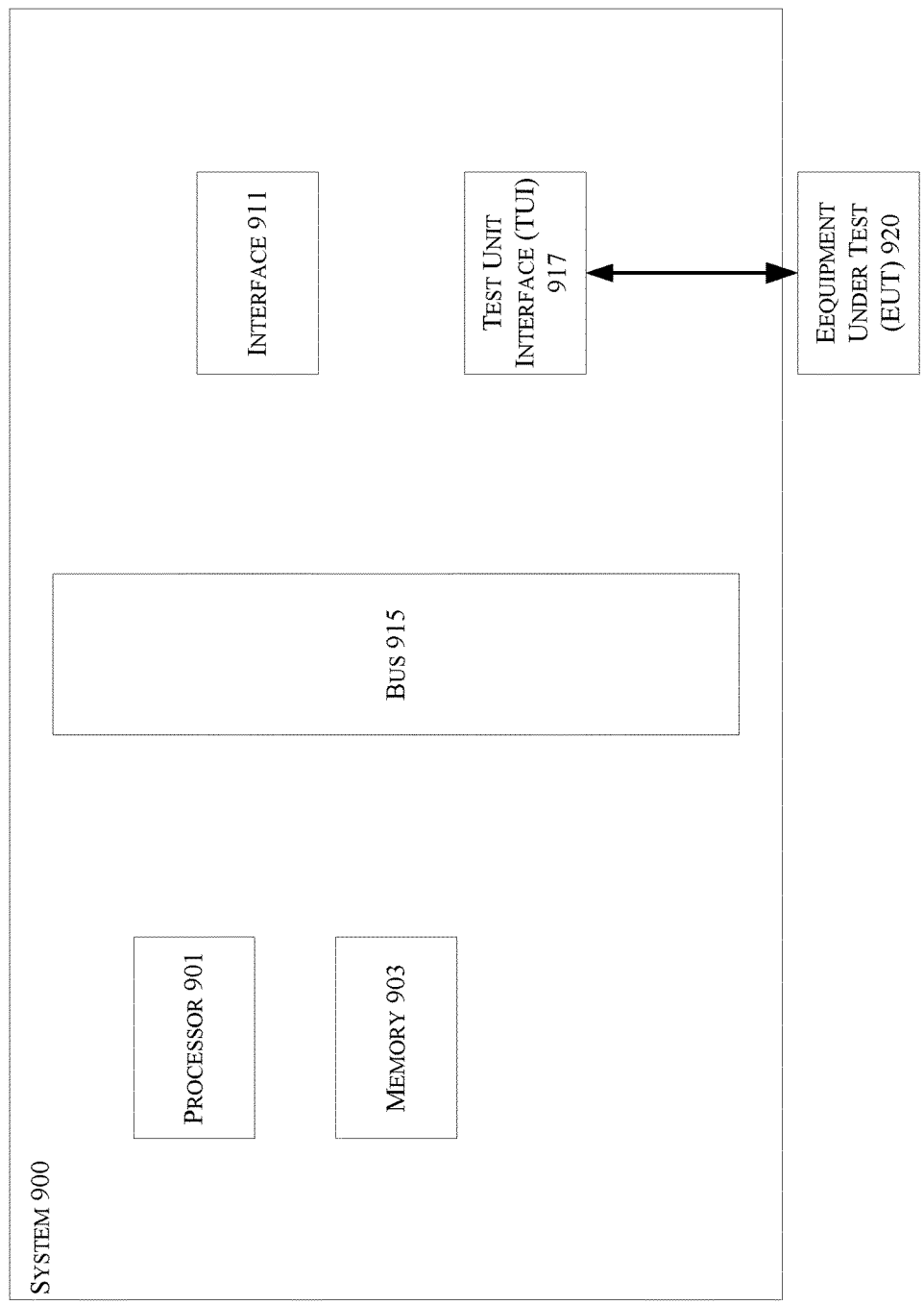
FIG. 9 is a block diagram illustrating an example of a system capable of implementing various processes and systems in accordance with one or more embodiments of the present disclosure.

FIG. 9 is a block diagram illustrating an example of a system 900 capable of implementing various processes and systems described in the present disclosure. In some embodiments, system 900 may be a power safety rating and/or testing and/or certifying device, such as a computer and/or a mobile device, and one or more embodiments may be implemented in the form of a non-transitory computer readable medium storing one or more programs. According to particular embodiments, a system 900, suitable for implementing particular embodiments of the present disclosure, includes a processor 901, a memory 903, an interface 911, a bus 915 (e.g., a PCI bus or other interconnection fabric), and a test unit interface (TUI) 917, and operates to analyze and determine arc flash hazards. Operatively coupled to the processor 901, the TUI 917 is further configured to connect to an equipment under test (EUT) 920 of an electrical power system (not shown). In some embodiments, when acting under the control of appropriate software or firmware, the processor 901 is responsible for determining an arc current at the EUT (such as in step 602), determining a value of 400-Hz arc flash incident energy by use of the arc flash model (such as in step 610), performing a short-circuit analysis of the equipment to determine bolted fault currents and equivalent impedances (such as in step 502), obtaining trip currents and a pair of corresponding trip times for a protection equipment (such as in step 504), determining a Joule Integral (JI) or $I^2t$ value for the equipment (such as in step 506), and/or determining a 400-Hz arcing current based on a 60-Hz arcing current and the JI or $I^2t$ values (such as in step 508).

In other embodiments, processor 901 may be responsible for determining an arc flash protection boundary (612), and/or determining a level of Personal Protection Equipment (PPE) based on the value of the arc flash incident energy and National Fire Protection Association (NFPA)-70E guidelines (614), and/or reporting the level of PPE to a user (616). Various specially configured devices can also be used in place of a processor 901 or in addition to processor 901. In other embodiments, system 900 may also include one or more of the following elements: a pump, a tinting element, a heating element, a thermostat, and a concentration detector.

The interface 911 may be configured to send and receive data packets or data segments, for example, over a network. Particular examples of interfaces supports include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management.

According to particular example embodiments, the system 900 uses memory 903 to store data and program instructions for operations including determining an arc current at the EUT (such as in step 602), determining a value of 400-Hz arc flash incident energy by use of the arc flash model (such as in step 610), performing a short-circuit analysis of the equipment to determine bolted fault currents and equivalent impedances (such as in step 502), obtaining trip currents and a pair of corresponding trip times for a protection equipment (such as in step 504), determining a Joule Integral (JI) or $I^2t$ value for the equipment (such as in step 506), and/or determining a 400-Hz arcing current based on a 60-Hz arcing current and the JI or $I^2t$ values (such as in step 508). In other embodiments, memory 903 may store data and program instructions of operations including determining an arc flash protection boundary (612), and/or determining a level of Personal Protection Equipment (PPE) based on the value of the arc flash incident energy and National Fire Protection Association (NFPA)-70E guidelines (614), and/or reporting the level of PPE to a user (616). The program instructions may control the operation of an operating system and/or one or more applications, for example. The memory or memories may also be configured to store received metadata and batch requested metadata.

Because such information and program instructions may be employed to implement the systems/methods described herein, the present disclosure relates to tangible, or non-transitory, machine readable media that include program instructions, state information, etc. for performing various operations described herein. Examples of machine-readable media include hard disks, floppy disks, magnetic tape, optical media such as CD-ROM disks and DVDs; magneto-optical media such as optical disks, and hardware devices that are specially configured to store and perform program instructions, such as read-only memory devices (ROM) and programmable read-only memory devices (PROMs). Examples of program instructions include both machine code, such as produced by a compiler, and files containing higher level code that may be executed by the computer using an interpreter.

While the present disclosure has been particularly shown and described with reference to specific embodiments thereof, it will be understood by those skilled in the art that changes in the form and details of the disclosed embodiments may be made without departing from the spirit or scope of the present disclosure. It is therefore intended that the present disclosure be interpreted to include all variations and equivalents that fall within the true spirit and scope of the present disclosure. Although many of the components and processes are described above in the singular for convenience, it will be appreciated by one of skill in the art that multiple components and repeated processes can also be used to practice the techniques of the present disclosure.

While the present disclosure has been particularly shown and described with reference to specific embodiments thereof, it will be understood by those skilled in the art that changes in the form and details of the disclosed embodiments may be made without departing from the spirit or scope of the present disclosure. It is therefore intended that the present disclosure be interpreted to include all variations and equivalents that fall within the true spirit and scope of the present disclosure. Although many of the components and processes are described above in the singular for convenience, it will be appreciated by one of skill in the art that multiple components and repeated processes can also be used to practice the techniques of the present disclosure.

The invention claimed is:

1. A power safety determination system, comprising:
   a processor (901); and
   a test unit interface (TUI) (917) operatively coupled to the processor, the test unit interface for connecting to an equipment under test (EUT) (920), the processor being programmed to execute instructions for controlling the TUI and perform operations, comprising:
      determining (602) an arc current (308) at the equipment;
      generating (604) an arc flash model (314A and 314B) based on the arc current; and
      determining (610) a value of 400-Hz arc flash incident energy (316) by use of the arc flash model, wherein a risk category (316) is determined by use of the value of arc flash incident energy based on NAFT-70E guidelines.

2. The power safety determination system of claim 1, wherein the arc current is determined by:
   performing (502) a short-circuit analysis of the equipment to determine a pair of bolted fault currents (420 and 422) and a pair of equivalent impedances (420 and 422) at a short circuit point at a first frequency of 60-Hz and a second frequency of 400-Hz, respectively;
   obtaining (504) a pair of trip currents (404) and a pair of corresponding trip times (406) for a protection equipment (220) at the first frequency of 60-Hz and the second frequency of 400-Hz, respectively;
   determining (506), by use of the trip currents and trip times, a pair of Joule Integral (JI) or $I^2t$ values of SA60 (408) and SA400 (410) for the equipment, wherein SA60 corresponds to a JI or $I^2t$ value for the first frequency of 60-Hz and SA400 corresponds to a JI or $I^2t$ value for the second frequency of 400-Hz; and
   determining (508) a 400-Hz arcing current based on a 60-Hz arcing current and the pair of SA60 and SA400.

3. The power safety determination of claim 2, wherein the 60-Hz arc current is determined by use of the bolted fault current at the first frequency of 60-Hz.

4. The power safety determination system of claim 2, wherein the 60-Hz arc current is determined by calculations specified in the Institute of Electrical and Electronic Engineers (IEEE) standard 1584.

5. The power safety determination system of claim 1, wherein the arc flash model comprises a function based on a ratio of a first power input at the first frequency 60-Hz and a second power input at the second frequency 400-Hz.

6. The power safety determination system of claim 5, wherein the arc flash model further comprises a value of electric field intensity of a 400-Hz arc relative to a 60-Hz arc.

7. The power safety determination of claim 1, wherein the arc flash model comprises a function based on a difference of first value of arc flash incident energy at the frequency of 60-Hz and a second value of arc flash incident energy at the frequency of 400-Hz, wherein the first value of arc flash incident energy is determined by calculations specified in Institute of Electrical and Electronic Engineers (IEEE) standard 1584.

8. The power safety determination of claim 1, wherein the instructions further comprise determining (612) an arc flash protection boundary by use of the determined 400-Hz arc flash incident energy.

9. The power safety determination of claim 1, wherein the value 400-Hz arc flash incident energy is normalized for an arc having an arc duration of 0.2 seconds and a distance of 610 mm from the arc.

10. The power safety determination of claim 1, wherein the instructions further comprise determining (614) a level of Personal Protection Equipment (PPE) based on the value of the 400-Hz arc flash incident energy and National Fire Protection Association (NFPA)-70E guidelines.

11. The power safety determination of claim 1, wherein the instructions further comprise reporting (616) the level of PPE to a user.

12. A method of determining (500) an arc current at an equipment (917) of an electrical power system (100), the method comprising:
   performing (502) a short-circuit analysis of the equipment to determine a pair of bolted fault currents (420 and 422) and a pair of equivalent impedances (420 and 422) at a short circuit point at a first frequency of 60-Hz and a second frequency of 400-Hz, respectively;
   obtaining (504) a pair of trip currents (404) and a pair of corresponding trip times (406) for a protection equipment (220) at the first frequency of 60-Hz and the second frequency of 400-Hz, respectively;
   determining (506), by use of the trip currents and trip times, a pair of Joule Integral (JI) or $I^2t$ values of SA60 (408) and SA400 (410) for the equipment, wherein SA60 corresponds to a JI or I2t value for the first frequency of 60-Hz and SA400 corresponds to a JI or I2t value for the second frequency of 400-Hz; and
   determining (508) a 400-Hz arcing current based on a 60-Hz arcing current and the pair of SA60 and SA400.

13. The method of claim 12, wherein the 60-Hz arc current is determined by use of the bolted fault current at the first frequency of 60-Hz.

14. The method of claim 12, wherein the 60-Hz arc current is determined by calculations specified in Institute of Electrical and Electronic Engineers (IEEE) standard 1584.

15. A method of analyzing arc flash hazard at an equipment (917) of an electrical power system (100), the method comprising:
   determining (602) an arc current (308) at the equipment;
   generating (604) an arc flash model (314A and 314B) based on the arc current; and
   determining (610) a value of 400-Hz arc flash incident energy (316) by use of the arc flash model.

16. The method of claim 15, wherein the arc current is determined by:
   performing (502) a short-circuit analysis of the equipment to determine a pair of bolted fault currents (420 and 422) and a pair of equivalent impedances (420 and 422) at a short circuit point at a first frequency of 60-Hz and a second frequency of 400-Hz, respectively;
   retrieving (504) a pair of trip currents (404) and a pair of corresponding trip times (406) for a protection equipment (220) at the first frequency of 60-Hz and the second frequency of 400-Hz, respectively;
   determining (506), by use of the trip currents and trip times, a pair of Joule Integral (JI) or $I^2t$ values of SA60 (408) and SA400 (410) for the equipment, wherein SA60 corresponds to a JI or $I^2t$ value for the first frequency of 60-Hz and SA400 corresponds to a JI or $I^2t$ value for the second frequency of 400-Hz; and
   determining (508) a 400-Hz arcing current based on a 60-Hz arcing current and the pair of SA60 and SA400.

17. The method of claim 16, wherein the 60-Hz arc current is determined by use of the bolted fault current at the first frequency of 60-Hz.

18. The method of claim 16, wherein the 60-Hz arc current is determined by calculations specified in institute of Electrical and Electronic Engineers (IEEE) standard 1584.

19. The method of claim 15, wherein the arc flash model comprises a function based on a ratio of a first power input at the first frequency 60-Hz and a second power input at the second frequency 400-Hz.

20. The method of claim 19, wherein the arc flash model further comprises a value of electric field intensity of a 400-Hz arc relative to a 60-Hz arc.

21. The method of claim 15, wherein the arc flash model comprises a function based on a difference of a first value of arc flash incident energy at the frequency of 60-Hz and a second value of arc flash incident energy at the frequency of 400-Hz, wherein the first value of arc flash incident energy is determined by calculations specified in Institute of Electrical and Electronic Engineers (IEEE) standard 1584.

22. The method of claim 15, further comprising determining (612) an arc flash protection boundary by use of the determined 400-Hz arc flash incident energy.

23. The method of claim 15, wherein the value of 400-Hz arc flash incident energy is normalized for an arc having an arc duration of 0.2 seconds and a distance of 610 mm from the arc.

24. The method of claim 15, further comprising determining (614) a level of Personal Protection Equipment (PPE) based on the value of the 400-Hz arc flash incident energy and National Fire Protection Association (NFPA)-70E guidelines.

25. The method of claim 15, further comprising reporting (616) the level of PPE to a user.

26. The method of claim 15, wherein the electrical power system comprises a multi-phase power system.

27. A non-transitory computer-readable storage medium having one or more programs configured for execution by a computer system (900) to analyze arc flash hazard at an equipment (917) of an electrical power system (100), the one or more programs comprising instructions for:
   determining (602), by a processor (901) of the computer system, an arc current (308) at the equipment;
   generating (604), by the processor, an arc flash model (314A and 314B) based on the arc current; and
   determining (610), by the processor, a value of 400-Hz arc flash incident energy (316) by use of the arc flash model.

28. The non-transitory computer-readable storage medium of claim 27, wherein the arc current is determined by:
   performing (504), by the processor, a short-circuit analysis of the equipment to determine a pair of bolted fault currents (420 and 422) and a pair of equivalent impedances (420 and 422) at a short circuit point at a first frequency of 60-Hz and a second frequency of 400-Hz, respectively;
   obtaining (504), by the processor, a pair of trip currents (404) and a pair of corresponding trip times (406) for a protection equipment (220) at the first frequency of 60-Hz and the second frequency of 400-Hz, respectively;
   determining (506), by the processor and by use of the trip currents and trip times, a pair of Joule Integral (JI) or $I^2t$ values of SA60 (408) and SA400 (410) for the equipment, wherein SA60 corresponds to a JI or $I^2t$ value for the first frequency of 60-Hz and SA400 corresponds to a JI or $I^2t$ value for the second frequency of 400-Hz; and
   determining (508), by the processor, a 400-Hz arcing current based on a 60-Hz arcing current and the pair of SA60 and SA400.

29. The non-transitory computer-readable storage medium of claim 28, wherein the 60-Hz arc current is determined by use of the bolted fault current at the first frequency of 60-Hz.

30. The non-transitory computer-readable storage medium of claim 28, wherein the 60-Hz arc current is determined by calculations specified in the Institute of Electrical and Electronic Engineers (IEEE) standard 1584.

31. The non-transitory computer-readable storage medium of claim 27, wherein the arc flash model comprises a function based on a ratio of a first power input at the first frequency 60-Hz and a second power input at the second frequency 400-Hz.

32. The non-transitory computer-readable storage medium of claim 27, wherein the arc flash model comprises a function based on a difference of first value of arc flash incident energy at the frequency of 60-Hz and a second value of arc flash incident energy at the frequency of 400-Hz, wherein the first value of arc flash incident energy is determined by calculations specified in the Institute of Electrical and Electronic Engineers (IEEE) standard 1584.

33. The non-transitory computer-readable storage medium of claim 27, wherein the instructions further comprise determining (612), by the processor, an arc flash protection boundary by use of the determined 400-Hz arc flash incident energy.

* * * * *